(12) United States Patent
Jeon et al.

(10) Patent No.: US 10,854,677 B2
(45) Date of Patent: Dec. 1, 2020

(54) IMAGE SENSOR

(71) Applicant: Samsung Electronics Co., Ltd., Suwon-si (KR)

(72) Inventors: Taek Soo Jeon, Hwaseong-si (KR); Kee Won Kim, Suwon-si (KR); Sang Hoon Uhm, Suwon-si (KR); Ki Joong Yoon, Goyang-si (KR); Ha Jin Lim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/565,553

(22) Filed: Sep. 10, 2019

(65) Prior Publication Data
US 2020/0243608 A1   Jul. 30, 2020

(30) Foreign Application Priority Data
Jan. 24, 2019   (KR) ........................ 10-2019-0009092

(51) Int. Cl.
*H01L 27/28*   (2006.01)
*H01L 27/30*   (2006.01)

(52) U.S. Cl.
CPC .......... *H01L 27/286* (2013.01); *H01L 27/281* (2013.01); *H01L 27/307* (2013.01)

(58) Field of Classification Search
CPC .... H01L 27/286; H01L 27/281; H01L 27/307
See application file for complete search history.

(56) References Cited

U.S. PATENT DOCUMENTS

| | | | |
|---|---|---|---|
| 9,673,258 B2 | 6/2017 | Choo et al. |
| 9,793,324 B2 | 10/2017 | Joei |
| 9,887,243 B2 | 2/2018 | Yamaguchi |
| 9,893,123 B2 | 2/2018 | Lee et al. |
| 9,954,018 B2 | 4/2018 | Yamaguchi |
| 2016/0366360 A1 | 12/2016 | Okamoto et al. |
| 2017/0170238 A1 | 6/2017 | Lee et al. |

FOREIGN PATENT DOCUMENTS

KR   20160015788   2/2016

*Primary Examiner* — Anthony Ho
(74) *Attorney, Agent, or Firm* — Myers Bigel, P.A.

(57) ABSTRACT

Image sensors with improved performance and a higher degree of integration are provided. The image sensors include a substrate including a first surface and a second surface opposite to each other, a first organic photoelectric conversion layer on the first surface of the substrate, a first penetration via connected to the first organic photoelectric conversion layer and extending through the substrate, a first floating diffusion region in the substrate adjacent to the second surface of the substrate, and a first transistor structure on the second surface of the substrate, wherein the first transistor structure includes a semiconductor layer configured to connect the first penetration via and the first floating diffusion region, a gate electrode on the semiconductor layer, and a gate dielectric film between the semiconductor layer and the gate electrode.

20 Claims, 23 Drawing Sheets

IMAGE SENSOR

CROSS REFERENCE TO RELATED APPLICATION

This application claims priority to Korean Patent Application No. 10-2019-0009092, filed on Jan. 24, 2019, and all the benefits accruing therefrom under 35 U.S.C. § 119, the disclosure of which is incorporated herein by reference in its entirety.

BACKGROUND

The present inventive concept relates to an image sensor. More specifically, the present inventive concept relates to an image sensor including an organic photoelectric conversion layer.

The image sensor is one example of semiconductor elements that convert optical information into electric signals. Such an image sensor may include a CCD (charge coupled device) type image sensor or a CMOS (Complementary Metal-Oxide Semiconductor) type image sensor.

Recently, a backside illumination (BSI) type image sensor in which incident light is irradiated through a backside of a semiconductor substrate and is photoelectrically converted so that pixels formed in the image sensor have an improved light-receiving efficiency and optical sensitivity has been researched.

SUMMARY

The present inventive concept provides image sensors having improved performance and a higher degree of integration.

The present inventive concept will become more apparent to one of ordinary skill in the art to which the present inventive concept pertains by referencing the detailed description of the present inventive concept given below.

According to some embodiments of the present inventive concept, there is provided an image sensor comprising a substrate including a first surface and a second surface opposite to each other, a first organic photoelectric conversion layer on the first surface of the substrate, a first penetration via connected to the first organic photoelectric conversion layer and extending through the substrate, a first floating diffusion region in the substrate adjacent to the second surface of the substrate, and a first transistor structure on the second surface of the substrate, wherein the first transistor structure includes a semiconductor layer configured to connect the first penetration via and the first floating diffusion region, a gate electrode on the semiconductor layer, and a gate dielectric film between the semiconductor layer and the gate electrode.

According to some embodiments of the present inventive concept, there is provided an image sensor comprising a substrate which includes a first surface configured to receive incident light, and a second surface opposite to the first surface, a floating diffusion region in the substrate adjacent to the second surface of the substrate, a penetration via extending through the substrate, a first interlayer insulating film on the second surface of the substrate, a first contact in the first interlayer insulating film and connected to the penetration via, a second contact in the first interlayer insulating film and connected to the floating diffusion region, and a transistor structure on the first interlayer insulating film, wherein the transistor structure includes a semiconductor layer configured to connect the first contact and the second contact, a gate electrode on the semiconductor layer, and a gate dielectric film between the semiconductor layer and the gate electrode.

According to some embodiments of the present inventive concept, there is provided an image sensor comprising a substrate including a first surface and a second surface opposite to each other, a first floating diffusion region in the substrate, a first lower electrode, a first organic photoelectric conversion layer and a first upper electrode sequentially stacked on the first surface of the substrate, and a first transfer transistor on the second surface of the substrate and configured to connect the first lower electrode and the first floating diffusion region, wherein the first transfer transistor is spaced apart from the second surface of the substrate.

BRIEF DESCRIPTION OF THE DRAWINGS

The above and other aspects and features of the present inventive concept will become more apparent by the descriptions of example embodiments herein with reference to the attached drawings, in which.

DETAILED DESCRIPTION

Hereinafter, image sensors according to some embodiments of the present inventive concept will be described with reference to FIGS. 1 to 23.

Figure 1:
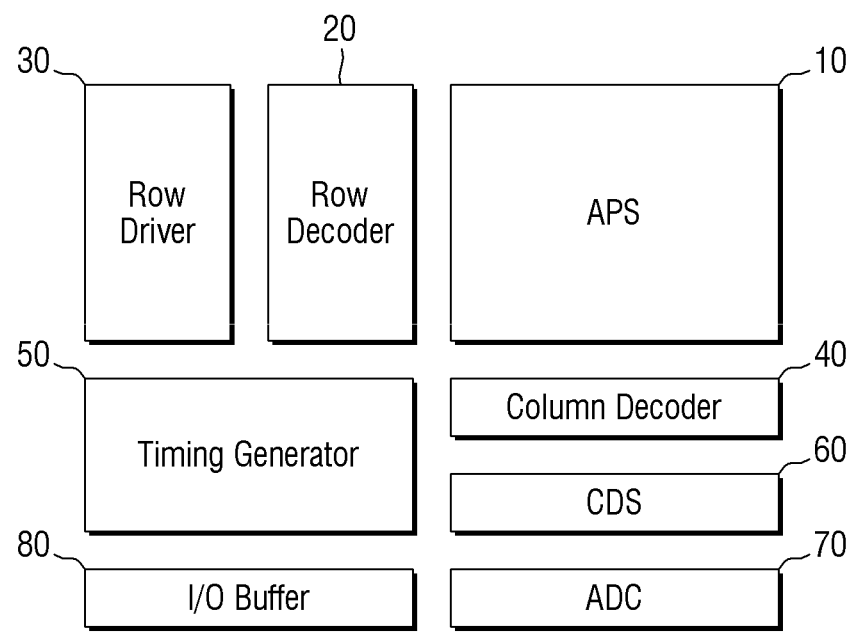
FIG. 1 is a block diagram of an image sensor according to some embodiments of the present inventive concept.
Figure 2:
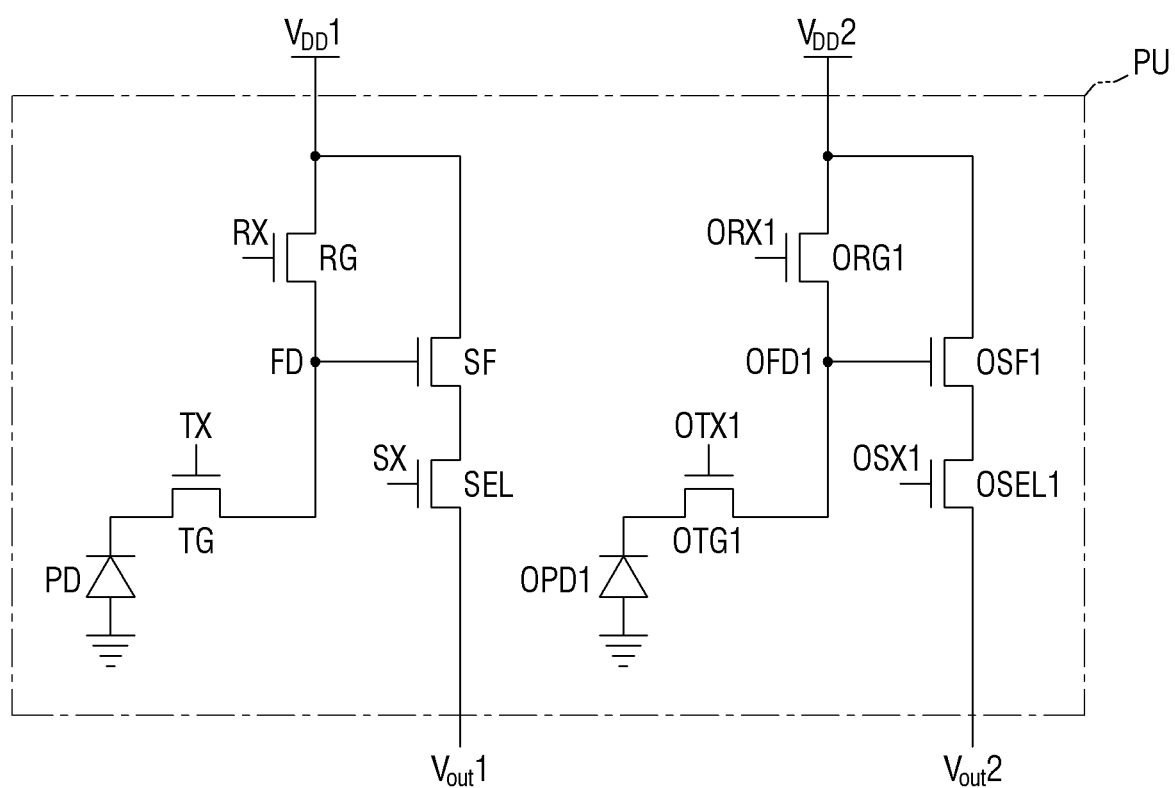
FIG. 2 is an example circuit diagram of a unit pixel region of an image sensor according to some embodiments of the present inventive concept.

FIG. 1 is a block diagram of an image sensor according to some embodiments of the present inventive concept. FIG. 2 is an example circuit diagram of a unit pixel region of an image sensor according to some embodiments of the present inventive concept.

Referring to FIG. 1, the image sensor according to some embodiments includes an active pixel sensor array (APS) 10, a row decoder 20, a row driver 30, a column decoder 40, a timing generator 50, a correlated double sampler (CDS) 60, an analog-to-digital converter (ADS) 70, and an I/O buffer 80.

The active pixel sensor array 10 includes a plurality of unit pixel regions two-dimensionally arranged, and may convert an optical signal into an electric signal. The active pixel sensor array 10 may be driven by a plurality of drive signals, such as pixel selection signals, reset signals, and charge transfer signals, from the row driver 30. Also, the electric signals converted by the active pixel sensor array 10 may be provided to the correlated double sampler 60.

The row driver 30 may provide a plurality of drive signals for driving the plurality of unit pixel regions according to the results decoded by the row decoder 20 to the active pixel sensor array 10. In a case where the unit pixel regions are arranged in a matrix form, a drive signal may be provided for each row.

The timing generator 50 may provide a timing signal and a control signal to the row decoder 20 and the column decoder 40.

The correlated double sampler (CDS) 60 may receive, hold and sample the electric signals generated by the active pixel sensor array 10. The correlated double sampler 60 may doubly sample a specific noise level and a signal level by an electric signal to output a difference level corresponding to a difference between the noise level and the signal level.

The analog-to-digital converter (ADC) 70 may convert the analog signal corresponding to the difference level output from the correlated double sampler 60 into a digital signal and output the digital signal.

The I/O buffer 80 latches the digital signal, and the latched signal may sequentially output the digital signal to a video signal processing unit (not illustrated) in accordance with the decoding result from the column decoder 40.

Referring to FIG. 2, a unit pixel region PU of the image sensor according to some embodiments may include a semiconductor photoelectric conversion element PD, a first transfer transistor TG, a first floating diffusion region FD, a first reset transistor RG, a first source follower transistor SF, a first selection transistor SEL, a first organic photoelectric conversion element OPD1, a second transfer transistor OTG1, a second floating diffusion region OFD1, a second reset transistor ORG1, a second source follower transistor OSF1, and a second selection transistor OSEL1.

The semiconductor photoelectric conversion element PD may accumulate electric charges corresponding to an amount of light by absorbing light. The semiconductor photoelectric conversion element PD may include, for example, a photo diode, a photo transistor, a photo gate, a pinned photo diode, an organic photo diode, a quantum dot, and combinations thereof.

The semiconductor photoelectric conversion element PD may be coupled with the first transfer transistor TG that transfers the accumulated charge to the first floating diffusion region FD. Since the first floating diffusion region FD is a region, which converts electric charges into a voltage and has a parasitic capacitance, electric charges may be stored in the first floating diffusion region FD in a cumulative manner.

The first transfer transistor TG may transmit the electric charges generated from the semiconductor photoelectric conversion element PD to the first floating diffusion region FD. The first transfer transistor TG may include a transistor driven by a transfer line which applies a predetermined bias (e.g., a first transfer signal TX). When the first transfer transistor TG is turned on by the first transfer signal TX, the electric charges generated from the semiconductor photoelectric conversion element PD may be transmitted to the first floating diffusion region FD.

The first source follower transistor SF may serve as a source follower buffer amplifier controlled by the first floating diffusion region FD. The first source follower transistor SF may amplify a change in the electrical potential of the first floating diffusion region FD and provide it to a first output line $V_{out}1$. For example, the predetermined electric potential (an output voltage; e.g., a first power supply voltage $V_{DD}1$) provided to a drain of the first source follower transistor SF is controlled by the first floating diffusion region FD and may be provided to the first output line $V_{out}1$.

The first selection transistor SEL may select unit pixel regions to be read in units of rows. The first selection transistor SEL may include a transistor driven by a selection line that applies a predetermined bias (e.g., a first row selection signal SX). For example, when the first selection transistor SEL is turned on by the first row selection signal SX, a predetermined electric potential (an output voltage; e.g., an electric potential provided from a source of the first source follower transistor SF) provided to the drain of the first selection transistor SEL may be output to the first output line $V_{out}1$.

The first reset transistor RG may periodically reset the first floating diffusion region FD. The first reset transistor RG may include a transistor driven by a reset line that applies a predetermined bias (e.g., a first reset signal RX). When the first reset transistor RG is turned on by the first reset signal RX, a predetermined electric potential (e.g., the first power supply voltage $V_{DD}1$) provided to the drain of the first reset transistor may be transferred to the first floating diffusion region FD.

The first organic photoelectric conversion element OPD1 may accumulate electric charges corresponding to the amount of light by absorbing light. The first organic photoelectric conversion element OPD1 may detect light of a wavelength different from the semiconductor photoelectric conversion element PD. For example, the semiconductor photoelectric conversion element PD may detect red light or blue light, and the first organic photoelectric conversion element OPD1 may detect green light.

The first organic photoelectric conversion element OPD1 may include, for example, an organic photo diode.

The first organic photoelectric conversion element OPD1 may be coupled with the second transfer transistor OTG1 that transmits the accumulated electric charge to the second floating diffusion region OFD1. Since the second floating diffusion region OFD1 is a region which converts the electric charges into a voltage and has a parasitic capacitance, the electric charges may be stored in an accumulative manner.

The second transfer transistor OTG1 may transmit the electric charges generated from the first organic photoelectric conversion element OPD1 to the second floating diffusion region OFD1. The second transfer transistor OTG1 may include a transistor driven by a transfer line that applies a predetermined bias (e.g., a second transfer signal OTX1). When the second transfer transistor OTG1 is turned on by the second transfer signal OTX1, the electric charges generated from the first organic photoelectric conversion element OPD1 may be transmitted to the second floating diffusion region OFD1.

The second source follower transistor OSF1 may function as a source follower buffer amplifier controlled by the second floating diffusion region OFD1. The second source follower transistor OSF1 may amplify the change in the electrical potential of the second floating diffusion region OFD1 and provide it to the second output line $V_{out}2$. For example, a predetermined electric potential (e.g., the second power supply voltage $V_{DD}2$) provided to the drain of the second source follower transistor OSF1 is controlled by the second floating diffusion region OFD1, and may be provided to the second output line $V_{out}2$.

The second selection transistor OSEL1 may select unit pixel regions to be read in units of rows. The second selection transistor OSEL1 may include a transistor driven by a selection line that applies a predetermined bias (e.g., a second row selection signal OSX1). For example, when the second selection transistor OSEL1 is turned on by the second row selection signal OSX1, a predetermined electric potential (e.g., electric potential provided from the source of the second source follower transistor OSF1) may be output to the second output line $V_{out}2$.

The second reset transistor ORG1 may periodically reset the second floating diffusion region OFD1. The second reset transistor ORG1 may include a transistor driven by a reset line that applies a predetermined bias (e.g., a second reset signal ORX1). When the second reset transistor ORG1 is turned on by the second reset signal ORX1, a predetermined electric potential (e.g., the second power supply voltage $V_{DD}2$) provided to the drain of the second reset transistor ORG1 may be transferred to the second floating diffusion region OFD1.

The first transfer signal TX, the first selection signal SX, the first reset signal RX, the second transfer signal OTX1, the second selection signal OSX1 and the second reset signal ORX1 may be output, for example, from the row driver 30 of FIG. 1.

Figure 3:
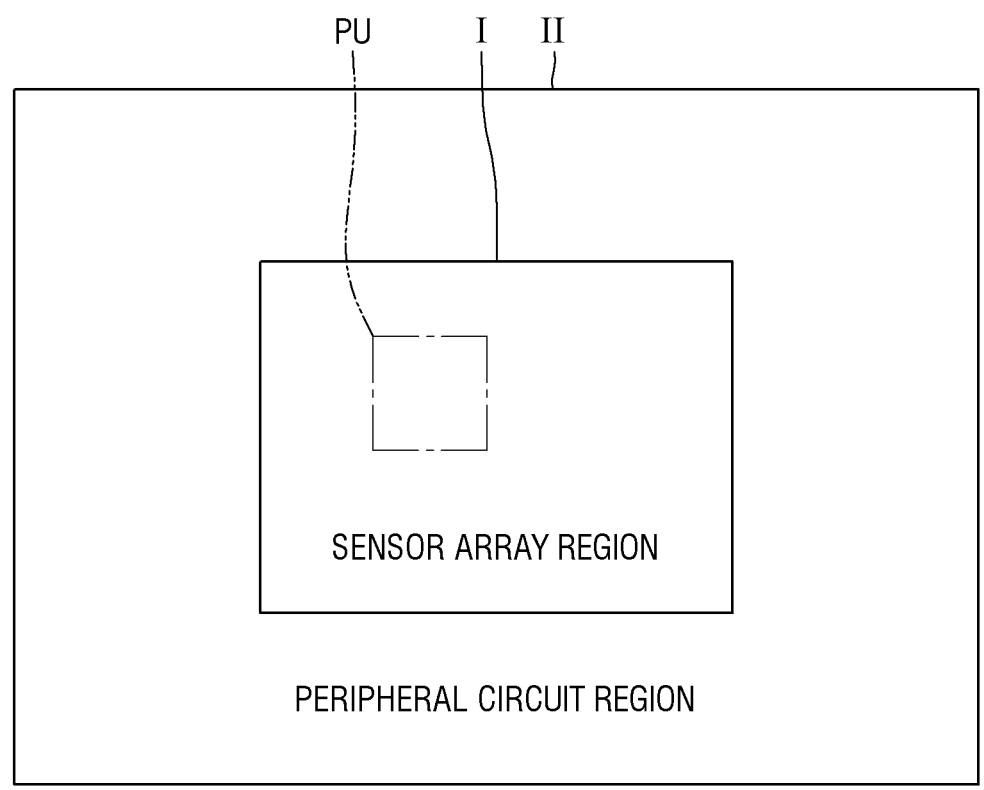
FIG. 3 is a schematic plan view of an image sensor according to some embodiments of the present inventive concept.
Figure 4:
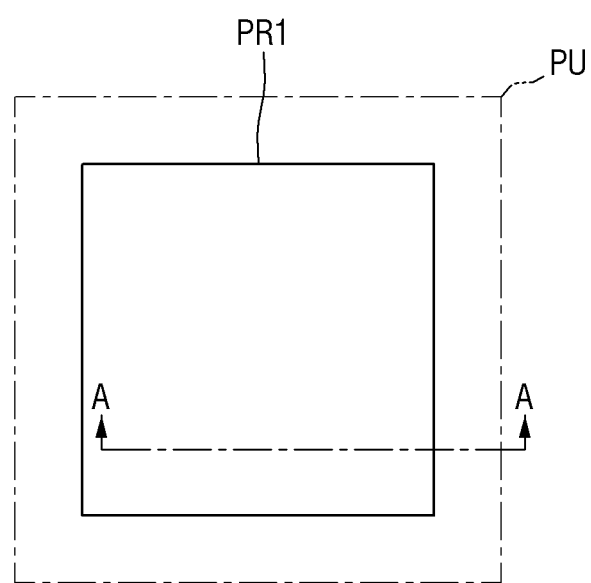
FIG. 4 is a layout diagram for explaining the unit pixel region of FIG. 3.
Figure 5:
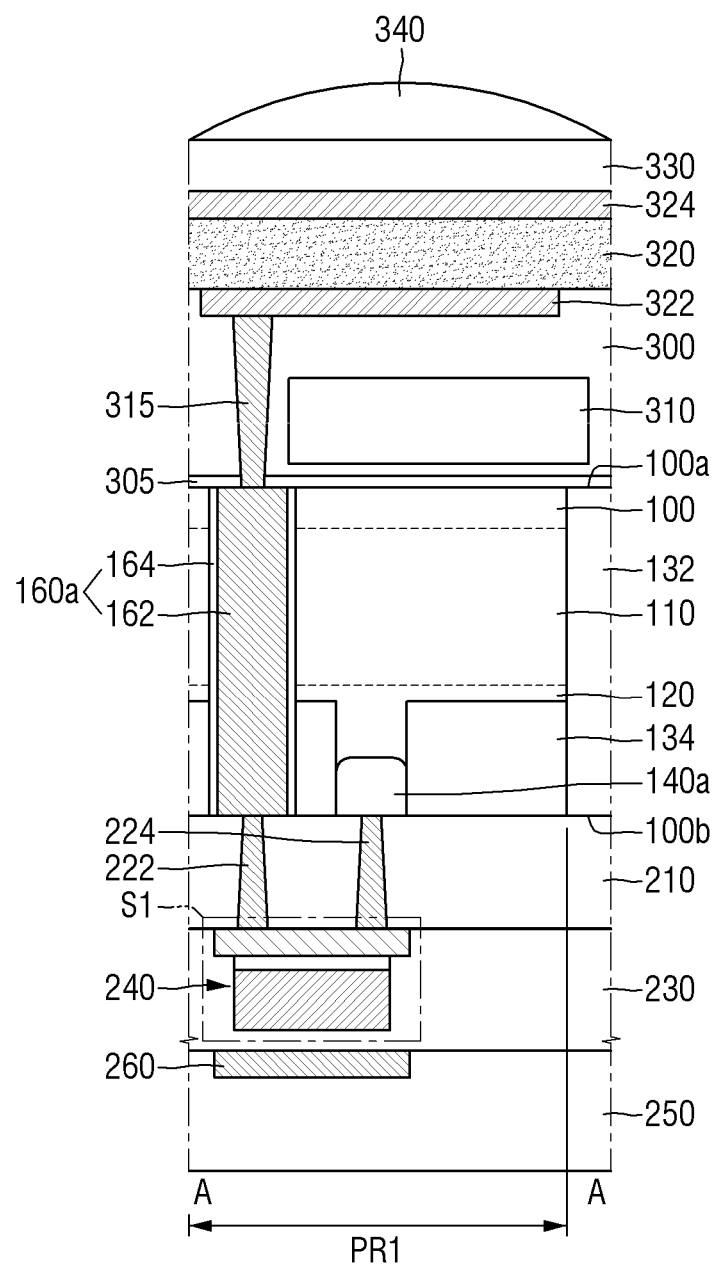
FIG. 5 is an example cross-sectional view taken along the line A-A of FIG. 4.
Figure 6:
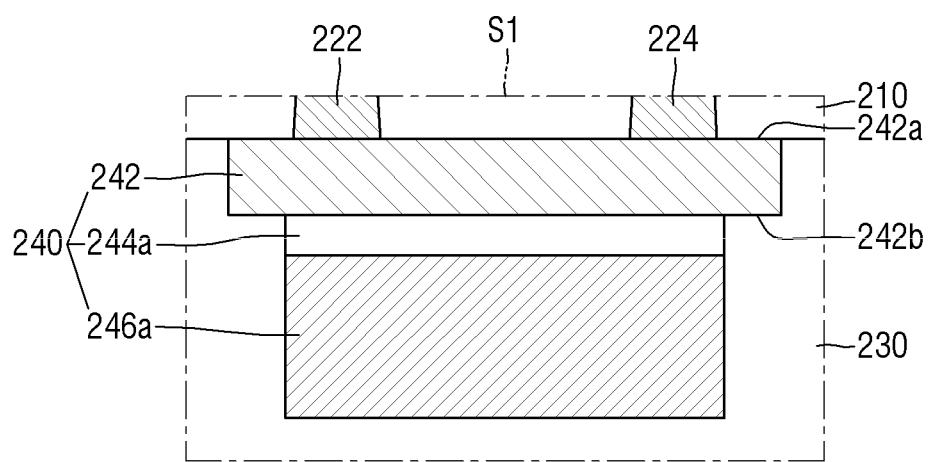
FIG. 6 is an enlarged view of the portion S1 in FIG. 5.

FIG. 3 is a schematic plan view of an image sensor according to some embodiments of the present inventive concept. FIG. 4 is a layout diagram for explaining the unit pixel region of FIG. 3. FIG. 5 is an example cross-sectional view taken along the line A-A of FIG. 4. FIG. 6 is an enlarged view of the portion S1 in FIG. 5. For the sake of convenience of explanation, repeated parts of description provided with reference to FIGS. 1 and 2 will be briefly described or omitted.

Referring to FIGS. 3 and 4, the image sensor according to some embodiments may include a sensor array region I and a peripheral circuit region II.

The sensor array region I may be, for example, a region in which the active pixel sensor array 10 of FIG. 1 is formed. The active pixel sensor array 10 of the sensor array region I may include a plurality of unit pixel regions. For example, the active pixel sensor array 10 of the sensor array region I may include the unit pixel region PU of FIG. 2.

The peripheral circuit region II may be, for example, a region in which the correlated double sampler 60, the analog-to-digital converter 70 and the like of FIG. 1 are formed. In FIG. 3, the peripheral circuit region II is illustrated as merely surrounding the sensor array region I, but the present inventive concept is not limited thereto. Although not illustrated, in some embodiments, the peripheral circuit region II may overlap the sensor array region I. For example, the peripheral circuit region II may be formed on a lower substrate, and the sensor array region I may be formed in an upper substrate stacked on the lower substrate.

The unit pixel region PU may include a first pixel PR1. Although FIG. 4 illustrates that only one first pixel PR1 is disposed in the unit pixel region PU, this is only for convenience of explanation, and the present inventive concept is not limited thereto. For example, a plurality of first pixels PR1 may be disposed in the unit pixel region PU.

Referring to FIGS. 3 to 6, the image sensor according to some embodiments includes a substrate 100, a semiconductor photoelectric conversion layer 110, a well impurity layer 120, a first element separation film 134, a first penetration via 160a, a second floating diffusion region 140a (OFD1 of FIG. 2), a first interlayer insulating film 300, a first lower electrode 322, a first organic photoelectric conversion layer 320, a first upper electrode 324, a micro lens 340, a second interlayer insulating film 210, and a first transistor structure 240.

The substrate 100 may include a first surface 100a and a second surface 100b opposite to each other. The first surface 100a of the substrate 100 may be a surface on which light is incident. For example, in FIG. 5, the first surface 100a may be a top surface of the substrate 100, and the second surface 100b may be a bottom surface of the substrate 100.

The substrate 100 may be, for example, bulk silicon or silicon-on-insulator (SOI). In some embodiments, the substrate 100 may be a silicon substrate or may include other materials, for example, silicon germanium, indium antimonide, lead tellurium compounds, indium arsenide, indium phosphide, gallium arsenide or gallium antimonide. In some embodiments, the substrate 100 may have an epitaxial layer formed on a base substrate.

The semiconductor photoelectric conversion layer 110 may be formed in the substrate 100. The semiconductor photoelectric conversion layer 110 may generate photocharge in proportion to the amount of light incident from the outside. That is, the semiconductor photoelectric conversion layer 110 may receive light and convert the optical signal into an electric signal. The semiconductor photoelectric conversion layer 110 may correspond to the semiconductor photoelectric conversion element PD of FIG. 2.

The semiconductor photoelectric conversion layer 110 may be formed by doping impurities into the substrate 100. For example, the semiconductor photoelectric conversion layer 110 may be formed by implanting n-type impurities into the substrate 100. Further, there may be a difference in impurity concentrations between the upper portion and the lower portion of the semiconductor photoelectric conversion layer 110 so that the semiconductor photoelectric conversion layer 110 may have a potential gradient. For example, the semiconductor photoelectric conversion layer 110 may be formed in the form in which a plurality of impurity regions is stacked.

For convenience of explanation, various transistors connected to the semiconductor photoelectric conversion layer 110 to process electric signals are not illustrated. However, a partial region of the substrate 100 may be utilized for disposing various transistors for processing electric signals generated from the semiconductor photoelectric conversion layer 110. For example, the first transfer transistor (TG of FIG. 2), the first reset transistor (RG of FIG. 2), the first source follower transistor (SF of FIG. 2) and the first selection transistor (SEL of FIG. 2) may be formed on the second surface 100b of the substrate 100. It will be understood that "connecting" or "being connected to" may refer to "electrically connecting" and "being electrically connected to."

The well impurity layer 120 may be formed adjacent to the semiconductor photoelectric conversion layer 110. For example, the well impurity layer 120 may be formed in the substrate 100 adjacent to the second surface 100b. The well impurity layer 120 may be formed by doping impurities having a conductivity type opposite to that of the semiconductor photoelectric conversion layer 110 into the substrate 100. For example, the well impurity layer 120 may be formed by ion implantation of p-type impurities.

The first element separation film 134 may define an active region in the first pixel PR1. For example, the first element separation film 134 may be formed in the substrate 100 adjacent to the second surface 100b. The first element separation film 134 may be formed by forming (e.g., burying) an insulating material in a shallow trench formed by patterning of the substrate 100. In addition, the first element separation film 134 may be formed in the well impurity layer 120. Thus, the first element separation film 134 may define the region of the well impurity layer 120, in which the first element separation film 134 is not formed, as an active region.

For example, the first element separation film 134 may define an active region such as the second floating diffusion region 140a in the well impurity layer 120. The second floating diffusion region 140a may be formed by doping impurities having a conductivity type opposite to that of the well impurity layer 120. For example, the second floating diffusion region 140a may be formed by ion implantation of n-type impurities. The second floating diffusion region 140a is connected to the first organic photoelectric conversion layer 320, and may store the electric signal generated from the first organic photoelectric conversion layer 320. The second floating diffusion region 140a may correspond to the second floating diffusion region OFD1 of FIG. 2.

The image sensor according to some embodiments may further include a second element separation film 132. The second element separation film 132 may define a first pixel PR1 in the unit pixel region PU. A depth at which the second element separation film 132 is formed may be greater than a depth at which the first element separation film 134 is formed. In some embodiments, the second element separation film 132 may be formed to surround the first pixel PR1 from a planar viewpoint. In some embodiments, the first element separation film 134 has a first depth from the second surface 100b of the substrate 100, the second element separation film 132 has a second depth from the second surface 100b of the substrate 100, and the second depth may be greater than the first depth as illustrated in FIG. 5.

The second element separation film 132 may be formed by forming (e.g., burying) an insulating material in a deep trench formed by patterning the substrate 100. For example, the second element separation film 132 may be formed to extend from the first surface 100a to the second surface 100b. According to the patterning process, the second element separation film 132 may have a shape in which a width changes in a direction from the second surface 100b to the first surface 100a. For example, unlike the width shown in FIG. 5, the width of the second element separation film 132 may gradually and/or monotonically decrease as it goes away from the second surface 100b of the substrate 100.

In some embodiments, the second element separation film 132 may include an insulating material having a lower refractive index than the substrate 100. For example, when the substrate 100 is formed of silicon, the second element separation film 132 may be formed of a silicon oxide layer, a silicon nitride layer, an undoped polysilicon layer, air, and combinations thereof. Thus, the second element separation film 132 may refract incident light obliquely incident on the semiconductor photoelectric conversion layer 110. Also, the second element separation film 132 may reduce or prevent photocharges generated at specific pixels by the incident light from moving to adjacent pixel regions due to, for example, a random drift. That is, the second element separation film 132 may improve the light reception rate of the semiconductor photoelectric conversion layer 110 to improve the quality of the image data.

A first penetration via 160a penetrates the substrate 100 and may extend from the first surface 100a to the second surface 100b. According to the patterning process, the first penetration via 160a may have a shape in which a width thereof changes in a direction from the second surface 100b to the first surface 100a. For example, unlike the width shown in FIG. 5, the width of the first penetration via 160a may be gradually and/or monotonically reduced as it goes away from the second surface 100b of the substrate 100.

In some embodiments, the first penetration via 160a may include a penetration conductor 162 and a penetration insulator 164. The penetration conductor 162 of the first penetration via 160a may penetrate the substrate 100 and extend from the second surface 100b to the first surface 100a. The penetration conductor 162 may include, for example, but is not limited to, silicon (Si). The penetration insulator 164 of the first penetration via 160a may surround the side walls of the penetration conductor 162. That is, the penetration insulator 164 may electrically insulate the substrate 100 from the penetration conductor 162. The penetration insulator 164 may include, for example, but is not limited to, silicon oxide.

The first interlayer insulating film 300 may be formed on the first surface 100a of the substrate 100. The first interlayer insulating film 300 may include, for example, at least one of silicon oxide, silicon nitride, silicon oxynitride and low dielectric constant (low-k) material having lower dielectric constant than silicon oxide. The low dielectric constant material may include, for example, but is not limited to, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped Silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, and combinations thereof.

The first color filter 310 may be formed on the first surface 100a of the substrate 100. For example, the first color filter 310 may be formed in the first interlayer insulating film 300.

In some embodiments, the first color filter 310 may include one color filter of a red filter or a blue filter. However, the present inventive concept is not limited thereto, and the first color filter 310 may include one color filter among a green filter, a yellow filter, a magenta filter, a cyan filter or a white filter.

The image sensor according to some embodiments may further include an anti-reflection film 305 on the first surface 100a of the substrate 100. The anti-reflection film 305 may be interposed, for example, between the substrate 100 and the first interlayer insulating film 300. The anti-reflection film 305 may reduce or prevent reflection of light that is incident into the substrate 100 from the first surface 100a of the substrate 100.

The anti-reflection film 305 is illustrated as being conformally formed along the first surface 100a of the substrate 100, but the present inventive concept is not limited thereto. The anti-reflection film 305 may be formed, for example, in the form of surrounding the lower surface and the side surfaces of the first color filter 310. In addition, although the anti-reflection film 305 is illustrated as a single film, it may also be formed by multi-films. In some embodiments, the anti-reflection film 305 may be omitted.

The first lower electrode 322 may be formed on the first interlayer insulating film 300. For example, the first lower electrode 322 may extend along a part of the upper surface of the first interlayer insulating film 300. Although the first lower electrode 322 is illustrated as being in (e.g., being buried in) the first interlayer insulating film 300, it is only an example, and the present inventive concept is not limited thereto.

The first organic photoelectric conversion layer 320 may be formed on the first lower electrode 322. For example, the first organic photoelectric conversion layer 320 may extend along the upper surface of the first lower electrode 322. The first organic photoelectric conversion layer 320 may generate photocharge in proportion to the amount of light incident from the outside. That is, the first organic photoelectric conversion layer 320 may receive light to convert the optical signal into an electric signal. The first organic photoelectric conversion layer 320 may correspond to the first organic photoelectric conversion element OPD1 of FIG. 2.

In some embodiments, the first organic photoelectric conversion layer 320 may detect light of wavelength different from that of the semiconductor photoelectric conversion layer 110. For example, the first organic photoelectric conversion layer 320 may detect green light. For example, light having a green wavelength among light incident from the outside may be absorbed by the first organic photoelectric conversion layer 320. Accordingly, the first organic photoelectric conversion layer 320 may provide an electric signal of green light. Light of other wavelengths except the green light may pass through the first organic photoelectric conversion layer 320.

Also, in some embodiments, the semiconductor photoelectric conversion layer 110 may detect red or blue light. For example, light having passed through the first organic photoelectric conversion layer 320 may pass through the first color filter 310 to provide red light or blue light to the semiconductor photoelectric conversion layer 110. Therefore, the semiconductor photoelectric conversion layer 110 may provide an electric signal of red light or blue light.

The first upper electrode 324 may be formed on the first organic photoelectric conversion layer 320. For example, the first upper electrode 324 may extend along the upper surface of the first organic photoelectric conversion layer 320. Accordingly, the first organic photoelectric conversion layer 320 may be interposed between the first lower electrode 322 and the first upper electrode 324. Voltages of different levels from each other may be applied to the first lower electrode 322 and the first upper electrode 324. For example, voltages of different levels from each other may be applied to the first lower electrode 322 and the first upper electrode 324 so that the electric signal generated from the first organic photoelectric conversion layer 320 is directed to the first lower electrode 322.

The first lower electrode 322 and the first upper electrode 324 may include a transparent conductive material. For example, the first lower electrode 322 and the first upper electrode 324 may include at least one of ITO (Indium Tin Oxide), ZnO (Zinc Oxide), $SnO_2$ (Tin Dioxide), ATO (Antimony-doped Tin Oxide), AZO (Aluminum-doped Zinc Oxide), GZO (Gallium-doped Zinc Oxide), $TiO_2$ (Titanium Dioxide), FTO (Fluorine-doped Tin Oxide), and combinations thereof. The first lower electrode 322 and the first upper electrode 324 may include the same material or different materials.

The first organic photoelectric conversion layer 320 may be connected to the first penetration via 160a. For example, the first lower electrode 322 connected to the first organic photoelectric conversion layer 320 may be electrically connected to the first penetration via 160a through the first contact 315. That is, the first contact 315 may penetrate the first interlayer insulating film 300 and connect the first lower electrode 322 to the first penetration via 160a.

In some embodiments, the width of the first contact 315 may gradually and/or monotonically increase as it goes away from the first surface 100a of the substrate 100. This may be attributed to the characteristics of the etching process utilized to form the first contact 315.

The first contact 315 may include a conductive material. For example, the first contact 315 may include a metal material such as tungsten (W), titanium (Ti), titanium nitride (TiN), copper (Cu), and aluminum (Al). Also, for example, the first contact 315 may include a metal oxide such as indium tin oxide (ITO) or indium zinc oxide (IZO), or a semiconductor material such as doped silicon.

The micro lens 340 may be formed on the first upper electrode 324. The micro lens 340 may have a convex shape and may have a predetermined curvature radius. Accordingly, the micro lens 340 may condense the light incident on the first pixel PR1.

The micro lens 340 may include, for example, but is not limited to, an organic material such as a light transmitting resin.

The image sensor according to some embodiments may further include a protective layer 330 interposed between the first upper electrode 324 and the micro lens 340. The protective layer 330 may include a transparent insulating material. The protective layer 330 may include, for example, but is not limited to, silicon oxide or metal oxide.

The second interlayer insulating film 210 may be formed on the second surface 100b of the substrate 100. The second interlayer insulating film 210 may include at least one of silicon oxide, silicon nitride, silicon oxynitride, and low dielectric constant (low-k) material having lower dielectric constant than silicon oxide.

The first transistor structure 240 may be disposed to be spaced apart from the second surface 100b of the substrate 100. For example, the first transistor structure 240 may be formed on the second interlayer insulating film 210. In some embodiments, the first transistor structure 240 may be a transfer transistor that transmits the electric signal generated from the first organic photoelectric conversion layer 320 to the second floating diffusion region 140a. For example, the first transistor structure 240 may correspond to the second transfer transistor OTG1 of FIG. 2.

The first transistor structure 240 may connect the first organic photoelectric conversion layer 320 and the second floating diffusion region 140a. For example, the first penetration via 160a connected to the first organic photoelectric conversion layer 320 may be connected to the first transistor structure 240 through the second contact 222. That is, the second contact 222 may penetrate the second interlayer insulating film 210 and connect the first penetration via 160a and the first transistor structure 240. Also, for example, the first transistor structure 240 may be connected to the second floating diffusion region 140a through the third contact 224. That is, the third contact 224 may penetrate the second interlayer insulating film 210 and connect the first transistor structure 240 and the second floating diffusion region 140a.

In some embodiments, the width of each of the second contact 222 and the width of the third contact 224 may gradually and/or monotonically increase as they are away from the second surface 100b of the substrate 100. This may be attributed to the characteristics of the etching process used to form the second contact 222 and the third contact 224.

In some embodiments, the second contact 222 and the third contact 224 may be formed at the same level. In the present specification, "the same level" means formation by the same manufacturing process. For example, the second contact 222 and the third contact 224 may have the same material configuration.

The second contact 222 and the third contact 224 may include a conductive material. For example, the second contact 222 and the third contact 224 may include a metal material such as tungsten (W), titanium (Ti), titanium nitride (TiN), copper (Cu), and aluminum (Al). In addition, for example, the second contact 222 and the third contact 224 may include a metal oxide such as indium tin oxide (ITO) or indium zinc oxide (IZO), or a semiconductor material such as doped silicon.

As illustrated in FIG. 6, the first transistor structure 240 may include a semiconductor layer 242, a first gate dielectric film 244a, and a first gate electrode 246a. It will be understood that the semiconductor layer 242 may be a region in which a channel of the first transistor structure 240 is formed when the first transistor structure 240 is turned on.

The semiconductor layer 242 may be formed on the second surface 100b of the substrate 100. In addition, the semiconductor layer 242 may be spaced apart from the second surface 100b of the substrate 100. For example, the semiconductor layer 242 may be formed on the second interlayer insulating film 210. The semiconductor layer 242 may connect the first penetration via 160a and the second floating diffusion region 140a. For example, the semiconductor layer 242 may be connected to the second contact 222 and the third contact 224. It will be understood that the semiconductor layer 242 may electrically connect the first penetration via 160a and the second floating diffusion region 140a when the first transistor structure 240 is turned on.

The semiconductor layer 242 may include a third surface 242a and a fourth surface 242b opposite to each other. The third surface 242a of the semiconductor layer 242 may be a surface facing the second surface 100b of the substrate 100. For example, in FIG. 6, the third surface 242a may be a top surface of the semiconductor layer 242, and the fourth surface 242b may be a bottom surface of the semiconductor layer 242.

In some embodiments, the second contact 222 and the third contact 224 may be connected to the third surface 242a of the semiconductor layer 242. For example, the second contact 222 and the third contact 224 penetrating the second interlayer insulating film 210 may be directly connected to the third surface 242a of the semiconductor layer 242. In some embodiments, the second contact 222 and the third contact 224 may contact (e.g., directly contact) the third surface 242a of the semiconductor layer 242 as shown in FIG. 6.

The semiconductor layer 242 may include a semiconductor material. For example, the semiconductor layer 242 may include, but is not limited to, at least one of a metal oxide semiconductor material such as IGZO (indium gallium zinc oxide) or ITZO (indium tin zinc oxide), an elemental semiconductor material such as polysilicon (poly Si) or amorphous silicon (amorphous Si), an organic semiconductor material, a carbon semiconductor material such as graphene or carbon nanotube (CNT), and combinations thereof. In addition, the semiconductor layer 242 may include, for example, one of CdSe, CdS, ZnO, $SnO_2$, $MoS_2$, $TiO_2$, $Fe_2O_3$, $WO_3$, InGaZnO, $ZnO—Rh_2O_3$, $In_2O_3$, ZnInO, InGaO, InZnO, ZnSnO, and combinations thereof. In some embodiments, the semiconductor layer 242 may include IGZO to reduce leakage current.

The first gate dielectric film 244a may be formed on the semiconductor layer 242. In some embodiments, the first gate dielectric film 244a may be formed on the fourth surface 242b of the semiconductor layer 242. For example, the first gate dielectric film 244a may conformally extend along the profile of the fourth surface 242b of the semiconductor layer 242. In some embodiments, the first gate dielectric film 244a may have a uniform thickness on the fourth surface 242b of the semiconductor layer 242 as shown in FIG. 6.

The first gate dielectric film 244a may include, for example, silicon oxide, silicon nitride, silicon oxynitride, and a high dielectric constant (high-k) material having a higher dielectric constant than silicon oxide. The high dielectric constant material may include, for example, but is not limited to, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

The first gate electrode 246a may be formed on the first gate dielectric film 244a. That is, the first gate dielectric film 244a may be interposed between the semiconductor layer 242 and the first gate electrode 246a. Further, at least a part of the first gate electrode 246a may be interposed between the second contact 222 and the third contact 224. However, the first gate electrode 246a may be electrically insulated from the second contact 222 and the third contact 224.

In some embodiments, the first gate electrode 246a may be formed on the fourth surface 242b of the semiconductor layer 242. Therefore, the semiconductor layer 242 may be interposed between the substrate 100 and the first gate electrode 246a.

The first gate electrode 246a may control the electric signal generated from the first organic photoelectric conversion layer 320. For example, the first transistor structure 240 may be driven by a first gate electrode 246a that applies a predetermined bias (e.g., a second transfer signal (OTX1 of FIG. 2)). When the first transistor structure 240 is turned on by the first gate electrode 246a, the electric signal generated from the first organic photoelectric conversion layer 320 may be transmitted to the second floating diffusion region 140a through the semiconductor layer 242.

The first gate electrode 246a may include a conductive material. For example, the first gate electrode 246a may include a metal material such as tungsten (W), titanium (Ti), titanium nitride (TiN), copper (Cu), and aluminum (Al).

Also, for example, the first gate electrode 246a may include a metal oxide such as indium tin oxide (ITO) or indium zinc oxide (IZO), or a semiconductor material such as doped silicon.

The third interlayer insulating film 230 may be formed on the second interlayer insulating film 210. In some embodiments, the third interlayer insulating film 230 may cover the first transistor structure 240. The third interlayer insulating film 230 may include, for example, at least one of silicon oxide, silicon nitride, silicon oxynitride, and low dielectric constant (low-k) material having lower dielectric constant than silicon oxide.

The first wiring 260 may be formed on the third interlayer insulating film 230. Although it is not specifically illustrated, the first wiring 260 may be connected to various internal circuit elements (e.g., transistors, etc.) in the substrate 100. That is, the first wiring 260 may be used to construct the circuit of the image sensor according to some embodiments.

The fourth interlayer insulating film 250 may be formed on the third interlayer insulating film 230. In some embodiments, the fourth interlayer insulating film 250 may cover the first wiring 260. In FIG. 5, only three interlayer insulating films are illustrated on the second surface 100b of the substrate 100, but this is only for convenience of explanation, and the present inventive concept is not limited thereto.

Since the image sensor according to some embodiments includes a transfer transistor (e.g., a first transistor structure 240) that controls an electric signal generated from the first organic photoelectric conversion layer 320, it is possible to provide an image sensor with improved performance. For example, the first transistor structure 240 functioning as a transfer transistor enables a CDS (correlated double sampling) operation, by maintaining and sampling the electric signal generated from the first organic photoelectric conversion layer 320. That is, the image sensor according to some embodiments may provide an image sensor with improved performance, by improving (e.g., reducing) the noise of the electric signal generated from the first organic photoelectric conversion layer 320.

In addition, since the image sensor according to some embodiments includes a transfer transistor (e.g., a first transistor structure 240) that is spaced apart from the substrate 100, it is possible to provide an image sensor with improved performance and degree of integration. For example, since the first transistor structure 240 is spaced apart from the second surface 100b of the substrate 100, it may be possible to reduce or prevent leakage current generated in the substrate 100 by the first transistor structure 240, thereby improving the performance of the image sensor. Also, for example, since the first transistor structure 240 is spaced apart from the second surface 100b of the substrate 100, by providing an extra space in the second surface 100b of the substrate 100, the degree of integration of the image sensor can be improved (e.g., increased).

Figure 7:
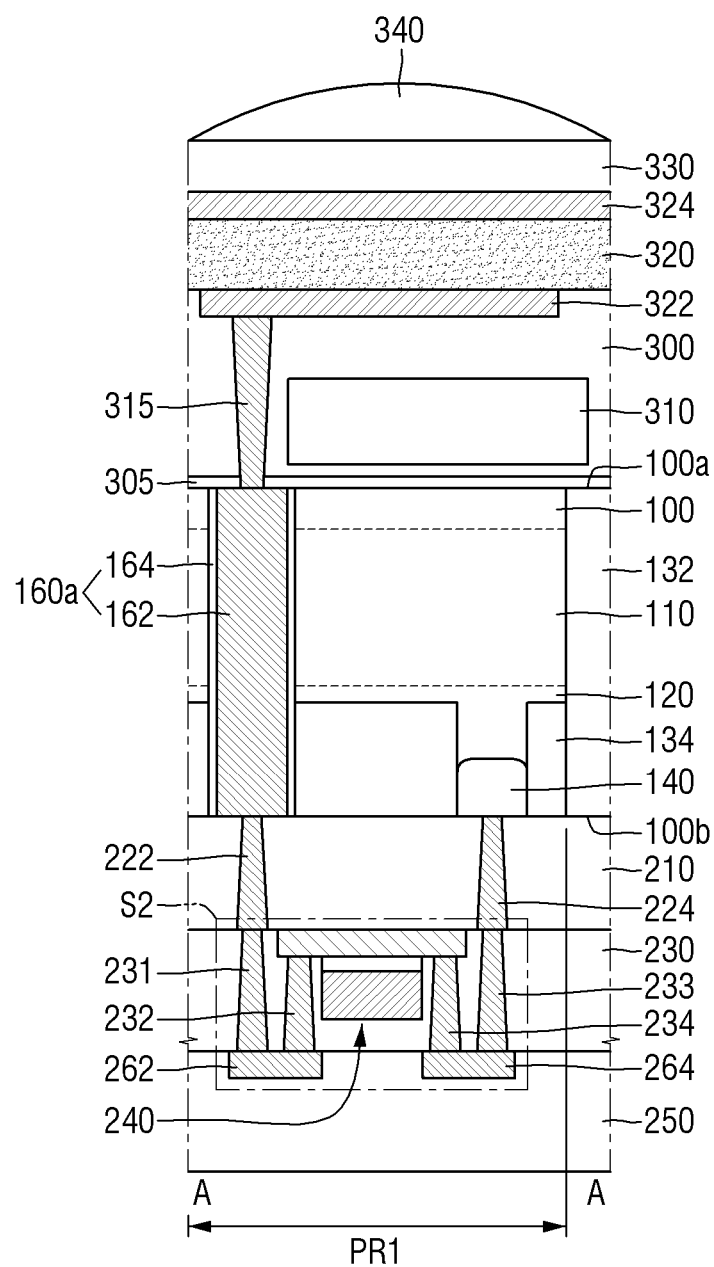
FIG. 7 is an example cross-sectional view illustrating an image sensor according to some embodiments of the present inventive concept.
Figure 8:
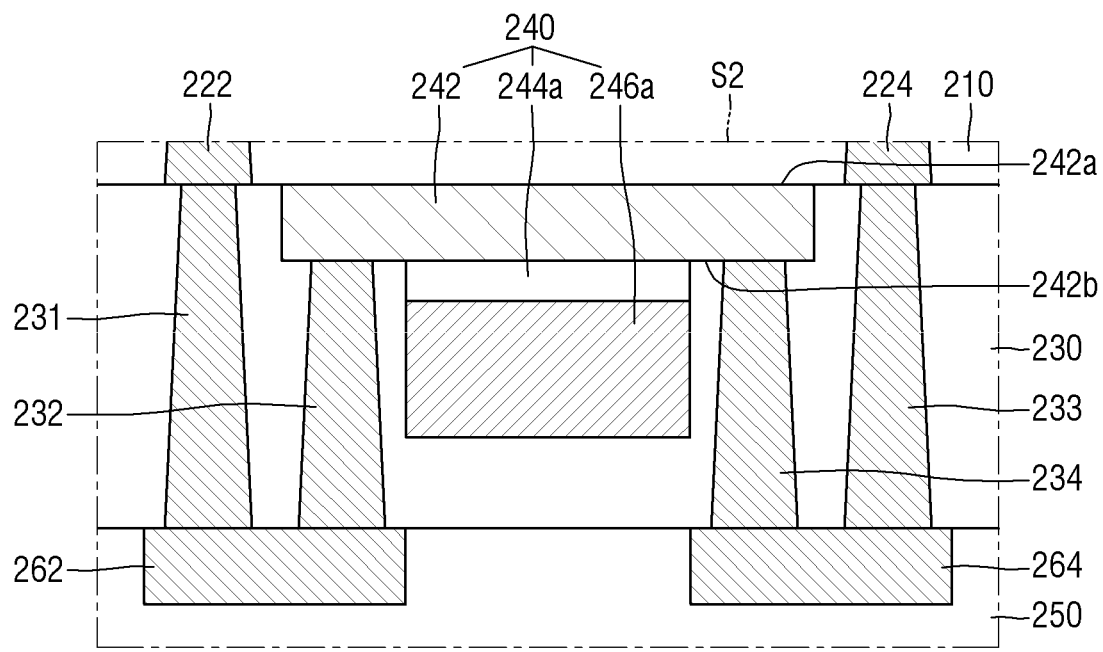
FIG. 8 is an enlarged view of the portion S2 of FIG. 7.

FIG. 7 is an example cross-sectional view illustrating an image sensor according to some embodiments of the present inventive concept. FIG. 8 is an enlarged view of the portion S2 of FIG. 7. For the sake of convenience of explanation, repeated parts of description provided with reference to FIGS. 1 to 6 will be briefly explained or omitted.

Referring to FIGS. 7 and 8, in the image sensor according to some embodiments, the second contact 222 and the third contact 224 are connected to a fourth surface 242b of the semiconductor layer 242.

For example, the second contact 222 may be connected to the fourth surface 242b of the semiconductor layer 242 through the fourth contact 231, the second wiring 262 and the fifth contact 232. The fourth contact 231 penetrates the third interlayer insulating film 230 and may be connected to the second contact 222. The second wiring 262 is formed on the third interlayer insulating film 230 and may be connected to the fourth contact 231. The fifth contact 232 penetrates the third interlayer insulating film 230, and may connect the second wiring 262 and the fourth surface 242b of the semiconductor layer 242.

Further, for example, the third contact 224 may be connected to the fourth surface 242b of the semiconductor layer 242 through the sixth contact 233, the third wiring 264, and the seventh contact 234. The sixth contact 233 penetrates the third interlayer insulating film 230 and may be connected to the third contact 224. The third wiring 264 is formed on the third interlayer insulating film 230 and may be connected to the sixth contact 233. The seventh contact 234 penetrates the third interlayer insulating film 230 and may connect the third wiring 264 and the fourth surface 242b of the semiconductor layer 242.

In some embodiments, the fourth to seventh contacts 231, 232, 233 and 234 may be formed at the same level. For example, the fourth to seventh contacts 231, 232, 233 and 234 may have the same material composition.

In some embodiments, the second wiring 262 and the third wiring 264 may be formed at the same level. For example, the second wiring 262 and the third wiring 264 may have the same material composition.

The fifth contact 232 and the seventh contact 234 may be formed, for example, by forming (e.g., burying) a conductive material in a trench formed by patterning of the third interlayer insulating film 230. That is, formation of an oxide film between the semiconductor layer 242 and the fifth contact 232 and between the semiconductor layer 242 and the seventh contact 234 may be reduced or prevented. Therefore, the contact resistance between the semiconductor layer 242 and the contacts is improved (e.g., reduced), and an image sensor with improved performance may be provided.

Figure 9:
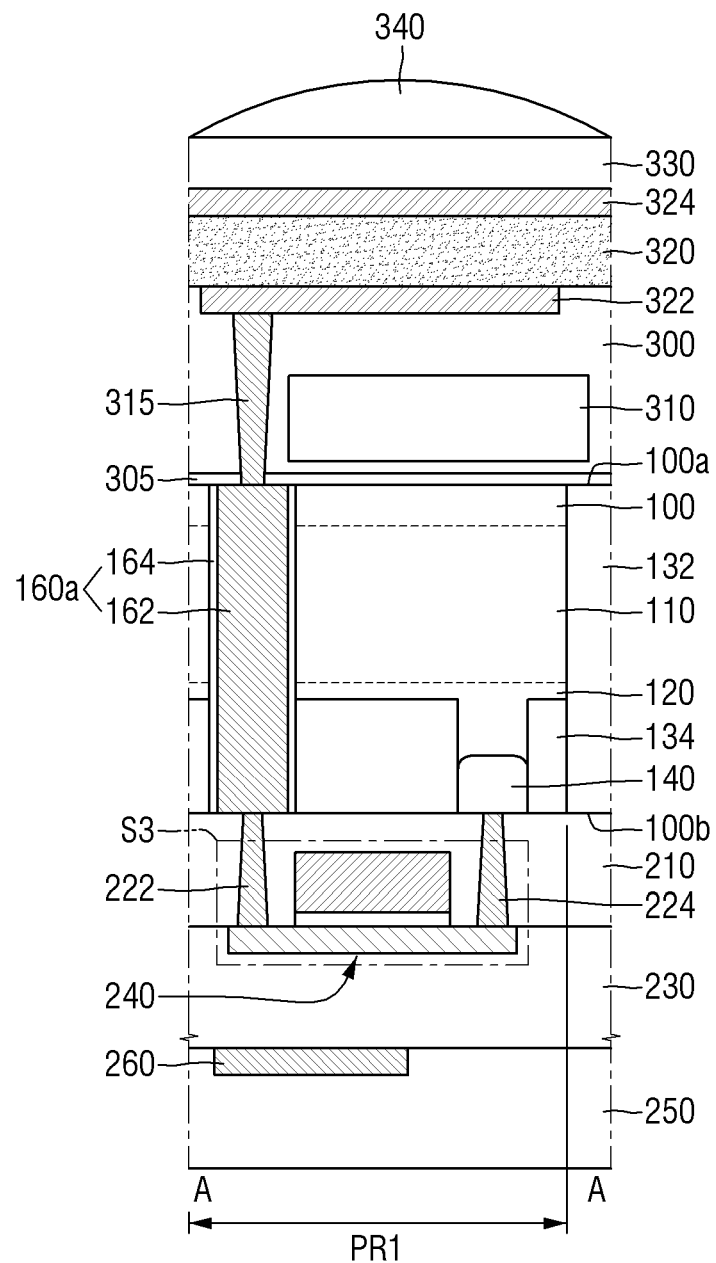
FIG. 9 is an example cross-sectional view illustrating an image sensor according to some embodiments of the present inventive concept.
Figure 10:
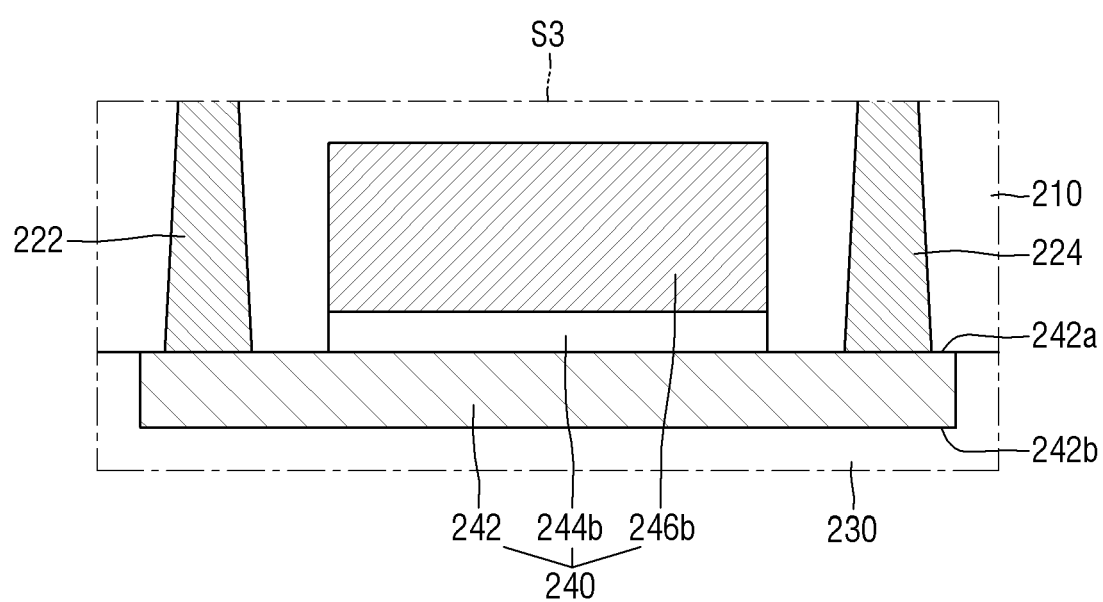
FIG. 10 is an enlarged view of the portion S3 of FIG. 9.

FIG. 9 is an example cross-sectional view illustrating an image sensor according to some embodiments of the present inventive concept. FIG. 10 is an enlarged view of the portion S3 of FIG. 9. For the sake of convenience of explanation, repeated parts of description provided with reference to FIGS. 1 to 6 will be briefly explained or omitted.

Referring to FIGS. 9 and 10, in the image sensor according to some embodiments, the first transistor structure 240 includes a semiconductor layer 242, a second gate dielectric film 244b, and a second gate electrode 246b.

In some embodiments, the second gate dielectric film 244b and the second gate electrode 246b are formed on the third surface 242a of the semiconductor layer 242. For example, the second gate dielectric film 244b and the second gate electrode 246b may be sequentially stacked on the third surface 242a of the semiconductor layer 242. Accordingly, the second gate dielectric film 244b and the second gate electrode 246b may be interposed between the substrate 100 and the semiconductor layer 242.

In some embodiments, the second gate dielectric film 244b and the second gate electrode 246b may be formed in the second interlayer insulating film 210. In some embodiments, the second gate electrode 246b may be spaced apart from the second surface 100b of the substrate 100.

Figure 11:
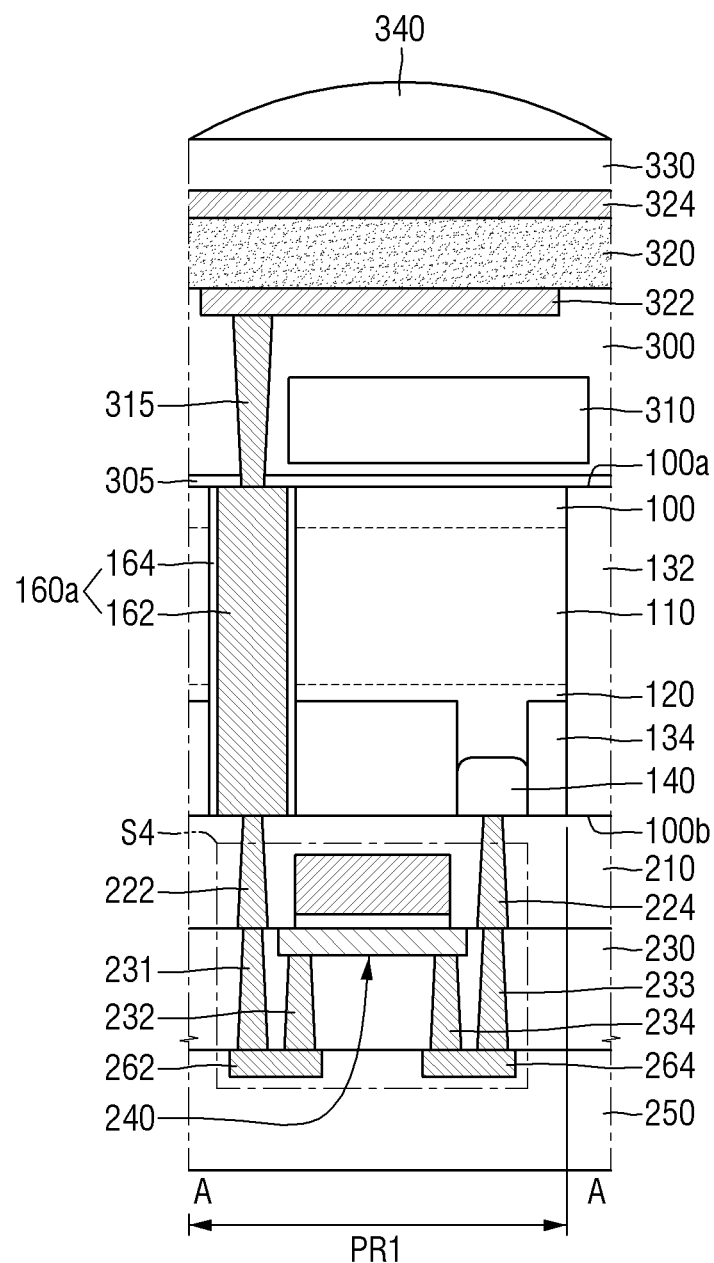
FIG. 11 is an example cross-sectional view illustrating an image sensor according to some embodiments of the present inventive concept.
Figure 12:
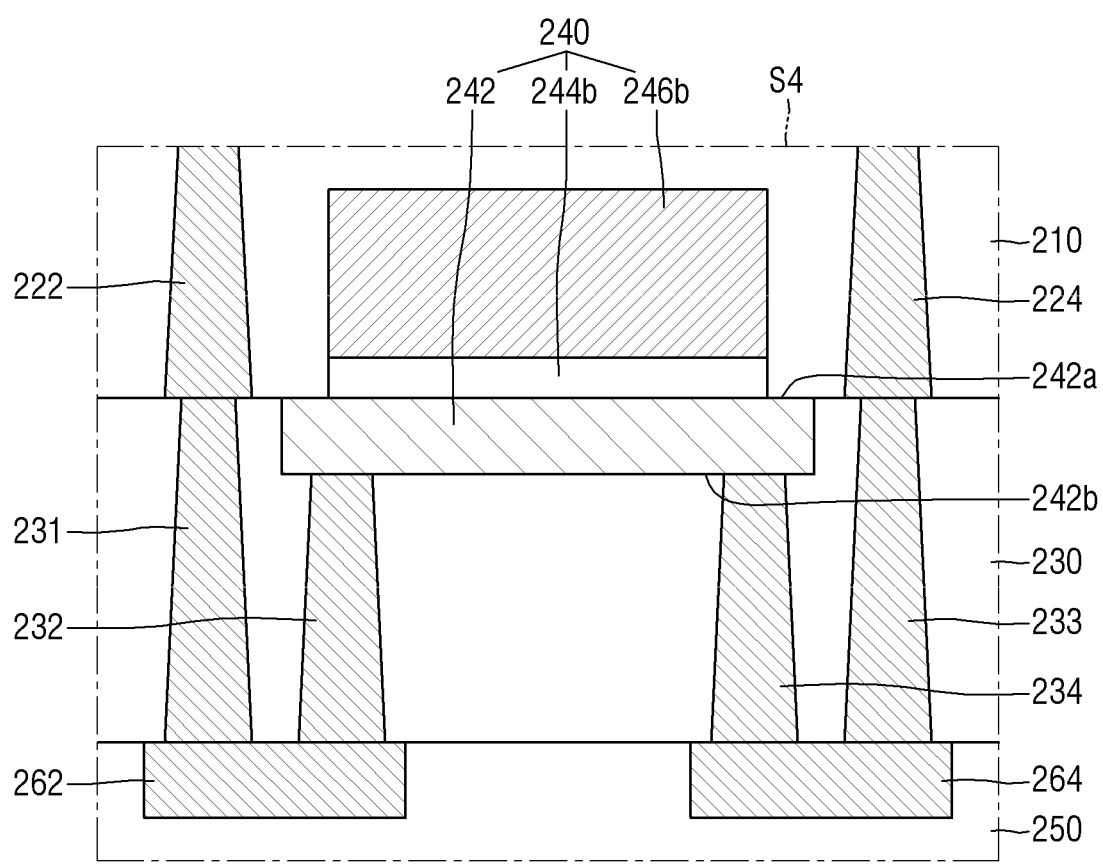
FIG. 12 is an enlarged view of the portion S4 of FIG. 11.

FIG. 11 is an example cross-sectional view illustrating an image sensor according to some embodiments of the present inventive concept. FIG. 12 is an enlarged view of the portion S4 of FIG. 11. For the sake of convenience of explanation, repeated parts of description provided with reference to FIGS. 1 to 10 will be briefly described or omitted.

Referring to FIGS. 11 and 12, in the image sensor according to some embodiments, the second contact 222 and the third contact 224 are connected to the fourth surface 242*b* of the semiconductor layer 242, and the second gate dielectric film 244*b* and the second gate electrode 246*b* are formed on the third surface 242*a* of the semiconductor layer 242.

For example, the second contact 222 may be connected to the fourth surface 242*b* of the semiconductor layer 242 through the fourth contact 231, the second wiring 262 and the fifth contact 232. For example, the third contact 224 may be connected to the fourth surface 242*b* of the semiconductor layer 242 through the sixth contact 233, the third wiring 264 and the seventh contact 234. For example, the second gate dielectric film 244*b* and the second gate electrode 246*b* may be sequentially stacked on the third surface 242*a* of the semiconductor layer 242.

Figure 13:
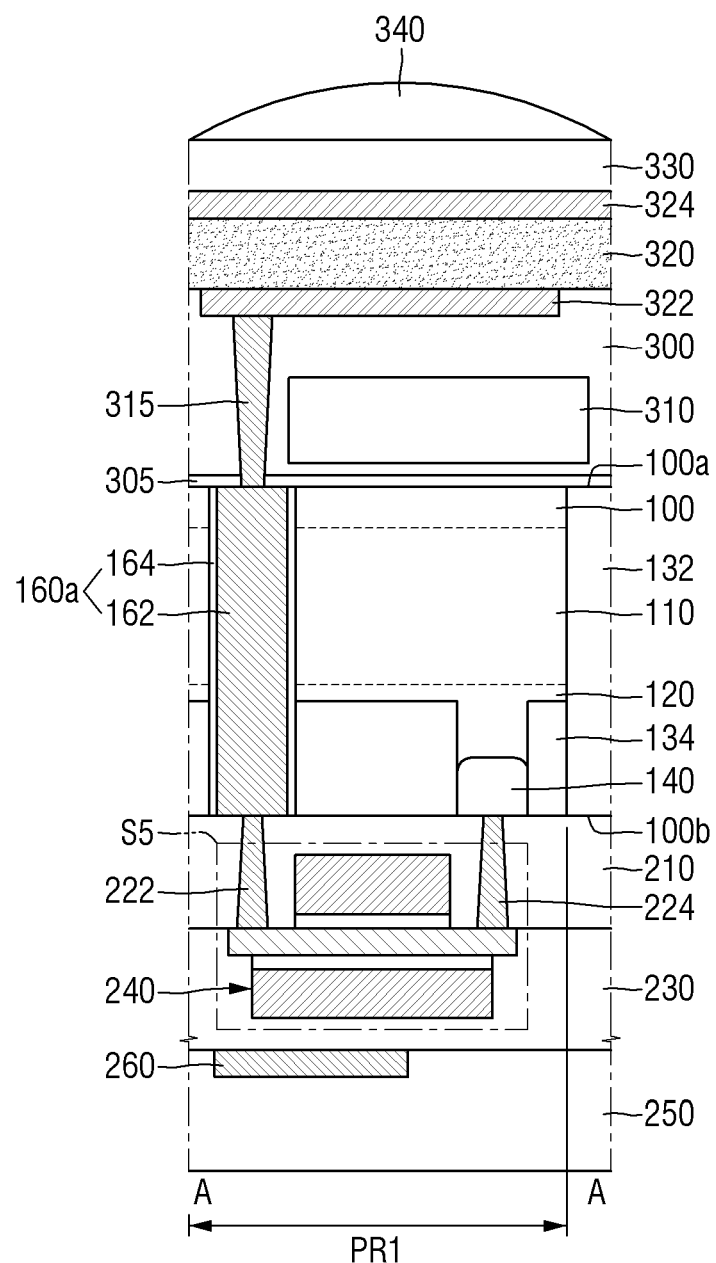
FIG. 13 is an example cross-sectional view illustrating an image sensor according to some embodiments of the present inventive concept.
Figure 14:
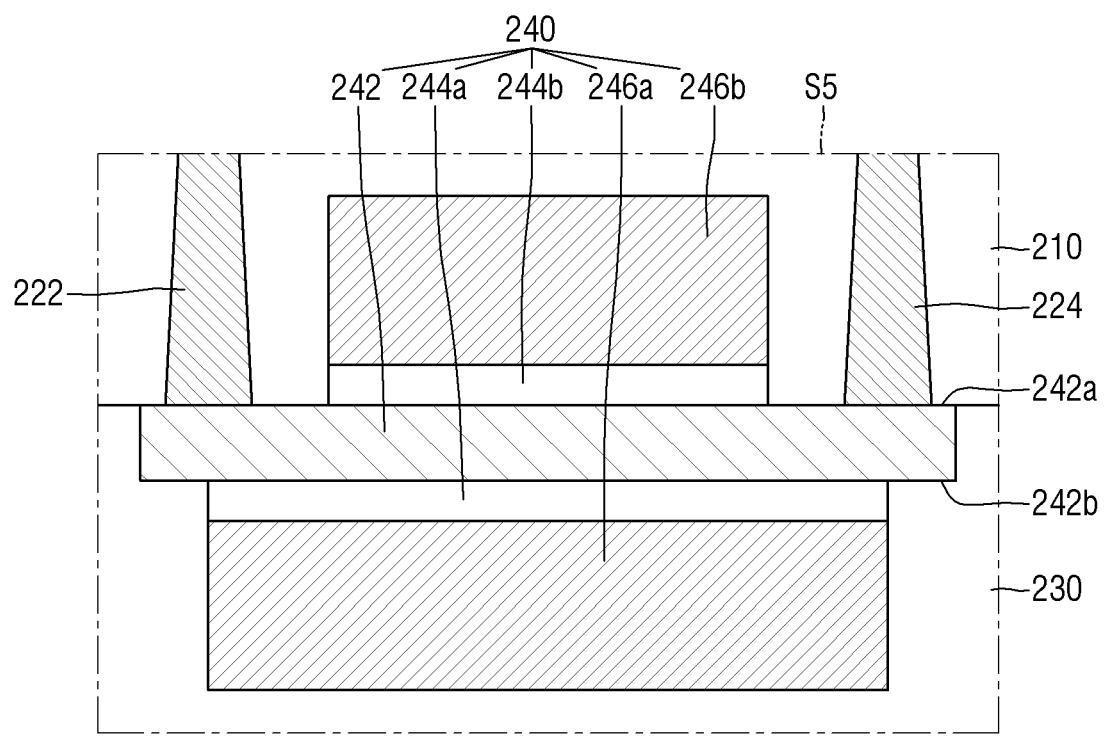
FIG. 14 is an enlarged view of the portion S5 of FIG. 13.

FIG. 13 is an example cross-sectional view illustrating an image sensor according to some embodiments of the present inventive concept. FIG. 14 is an enlarged view of the portion S5 of FIG. 13. For the sake of convenience of explanation, repeated parts of description provided with reference to FIGS. 1 to 12 will be briefly described or omitted.

Referring to FIGS. 13 and 14, in the image sensor according to some embodiments, a first transistor structure 240 includes a semiconductor layer 242, a first gate dielectric film 244*a*, a first gate electrode 246*a*, a second gate dielectric film 244*b* and a second gate electrode 246*b*.

The first gate dielectric film 244*a* and the first gate electrode 246*a* may be formed on the fourth surface 242*b* of the semiconductor layer 242, and the second gate dielectric film 244*b* and the second gate electrode 246*b* may be formed on the third surface 242*a* of the semiconductor layer 242.

In some embodiments, the second contact 222 and the third contact 224 may be connected to the third surface 242*a* of the semiconductor layer 242.

Figure 15:
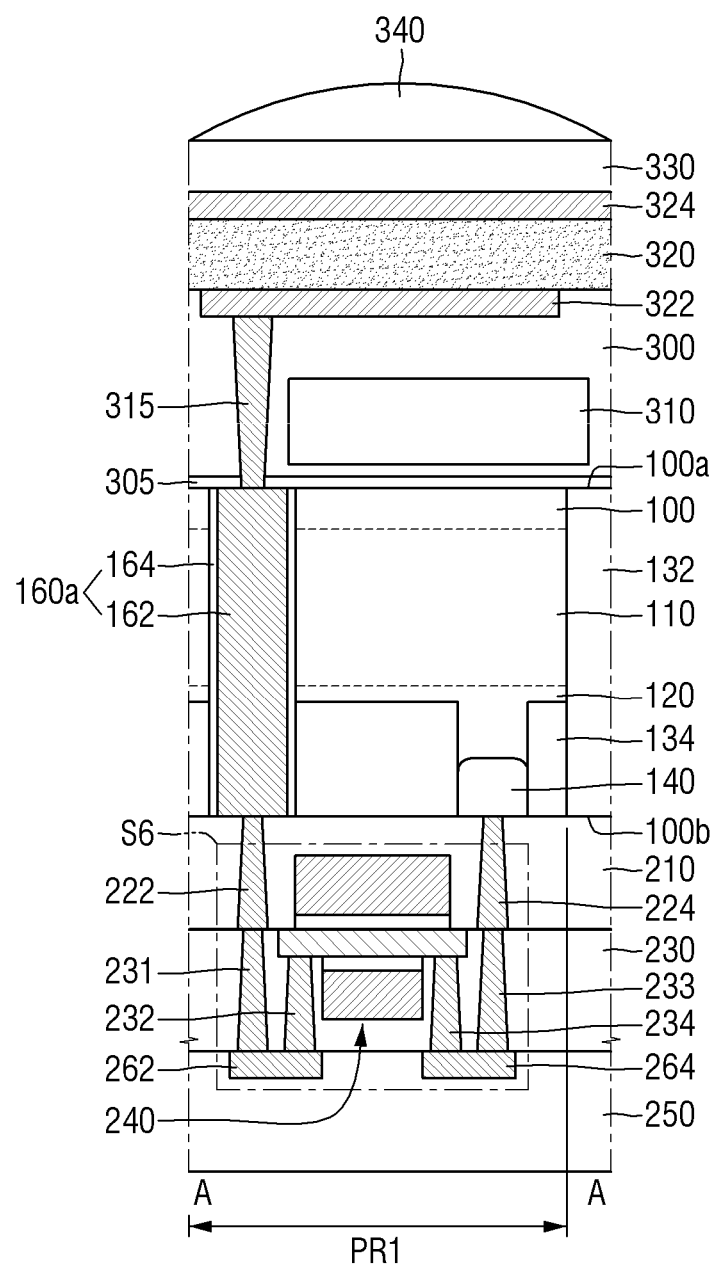
FIG. 15 is an example cross-sectional view illustrating an image sensor according to some embodiments of the present inventive concept.
Figure 16:
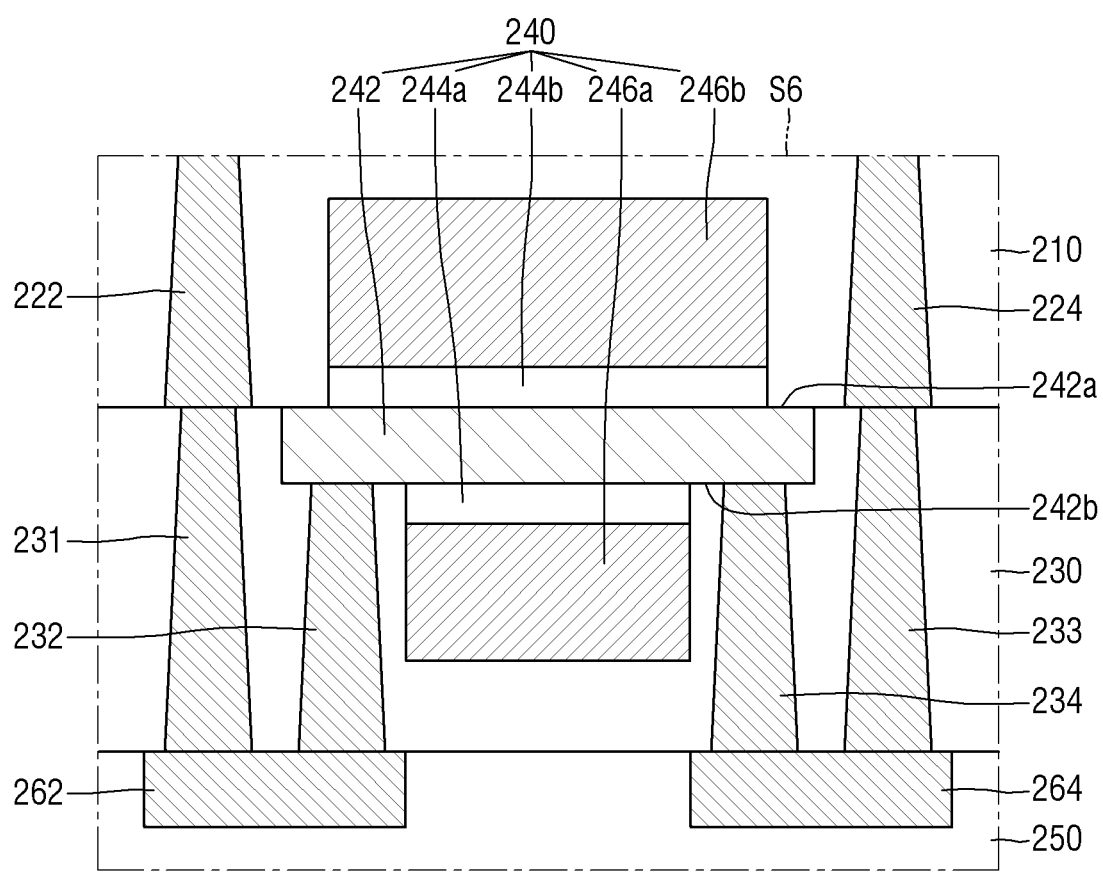
FIG. 16 is an enlarged view of the portion S6 of FIG. 15.

FIG. 15 is an example cross-sectional view illustrating an image sensor according to some embodiments of the present inventive concept. FIG. 16 is an enlarged view of the portion S6 of FIG. 15. For the sake of convenience of explanation, repeated parts of description provided with reference to FIGS. 1 to 14 will be briefly described or omitted.

Referring to FIGS. 15 and 16, in the image sensor according to some embodiments, the first transistor structure 240 includes a semiconductor layer 242, a first gate dielectric film 244*a*, a first gate electrode 246*a*, a second gate dielectric film 244*b* and a second gate electrode 246*b*. The second contact 222 and the third contact 224 are connected to the fourth surface 242*b* of the semiconductor layer 242.

For example, the second contact 222 may be connected to the fourth surface 242*b* of the semiconductor layer 242 through the fourth contact 231, the second wiring 262 and the fifth contact 232. For example, the third contact 224 may be connected to the fourth surface 242*b* of the semiconductor layer 242 through the sixth contact 233, the third wiring 264 and the seventh contact 234.

Figure 17:
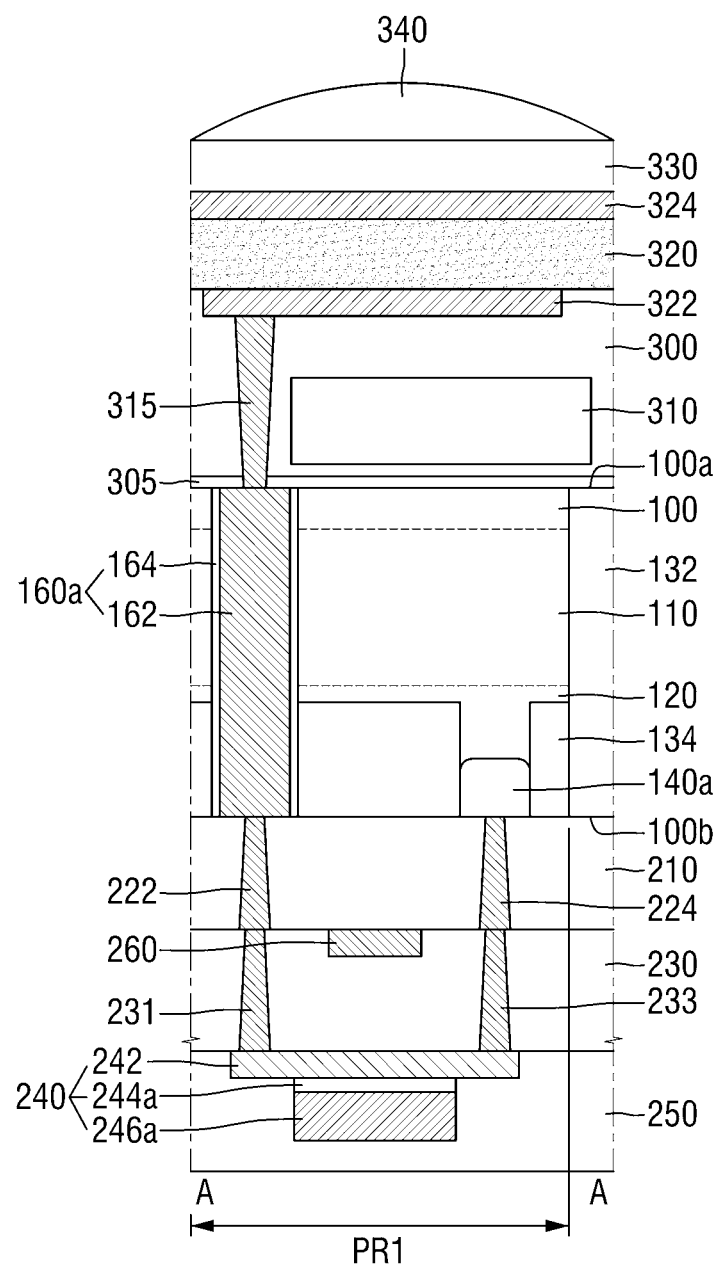
FIG. 17 is an example cross-sectional view illustrating an image sensor according to some embodiments of the present inventive concept.

FIG. 17 is an example cross-sectional view illustrating an image sensor according to some embodiments of the present inventive concept. For the sake of convenience of explanation, repeated parts of description provided with reference to FIGS. 1 to 6 will be briefly explained or omitted.

Referring to FIG. 17, in the image sensor according to some embodiments, a first wiring 260 is interposed between the substrate 100 and the first transistor structure 240.

For example, the first wiring 260 may be formed in the third interlayer insulating film 230, and the first transistor structure 240 may be formed over the third interlayer insulating film 230. Thus, the first transistor structure 240 may be further spaced apart from the second surface 100*b* of the substrate 100 than the first wiring 260.

In some embodiments, the first transistor structure 240 may be connected to the first penetration via 160*a* through a plurality of contacts. For example, the first penetration via 160*a* may be connected to the third surface 242*a* of the semiconductor layer 242 through the second contact 222 and the fourth contact 231.

In some embodiments, the first transistor structure 240 may be connected to the second floating diffusion region 140*a* through a plurality of contacts. For example, the second floating diffusion region 140*a* may be connected to the third surface 242*a* of the semiconductor layer 242 through the third contact 224 and the sixth contact 233.

Figure 18:
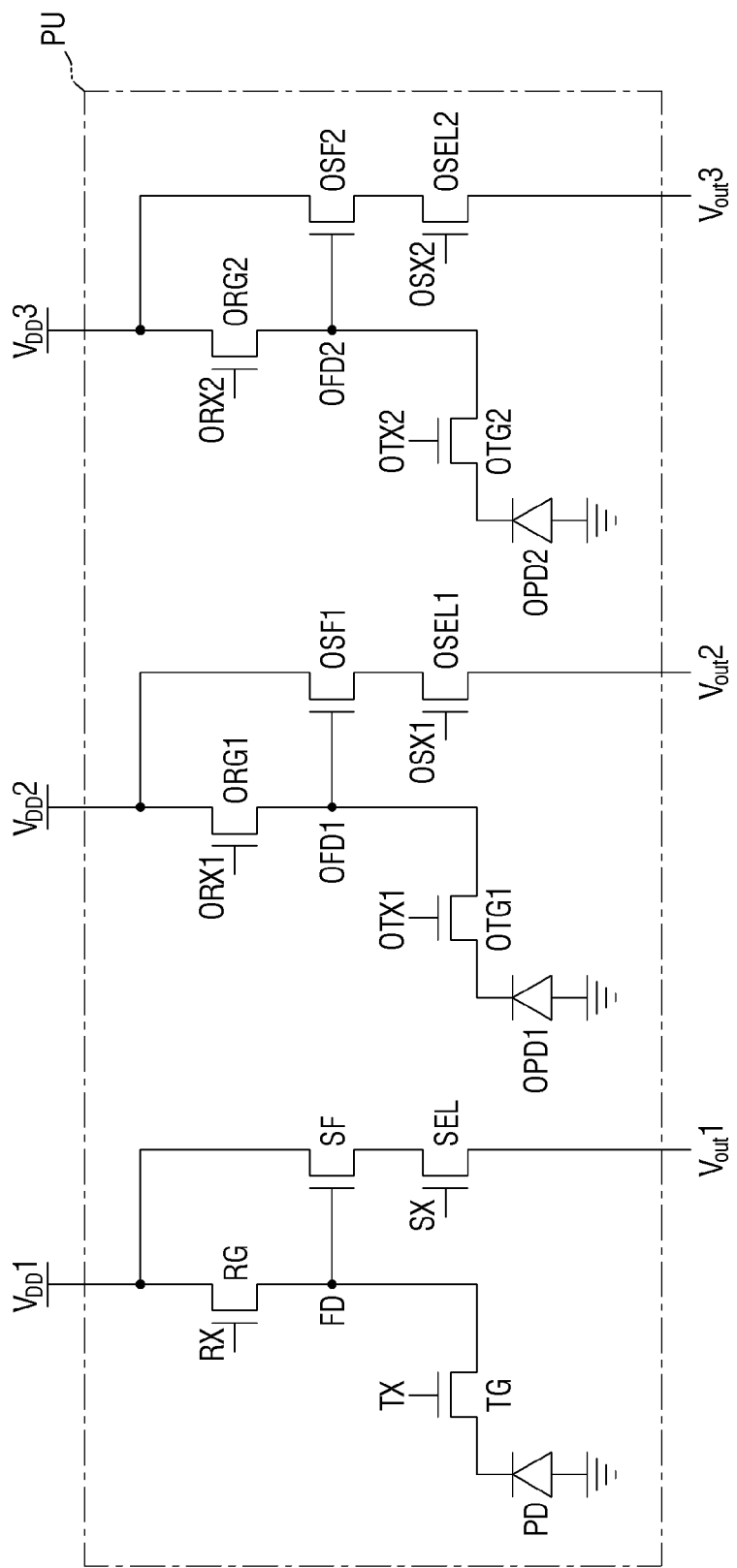
FIG. 18 is an example circuit diagram of a unit pixel region of an image sensor according to some embodiments of the present inventive concept.
Figure 19:
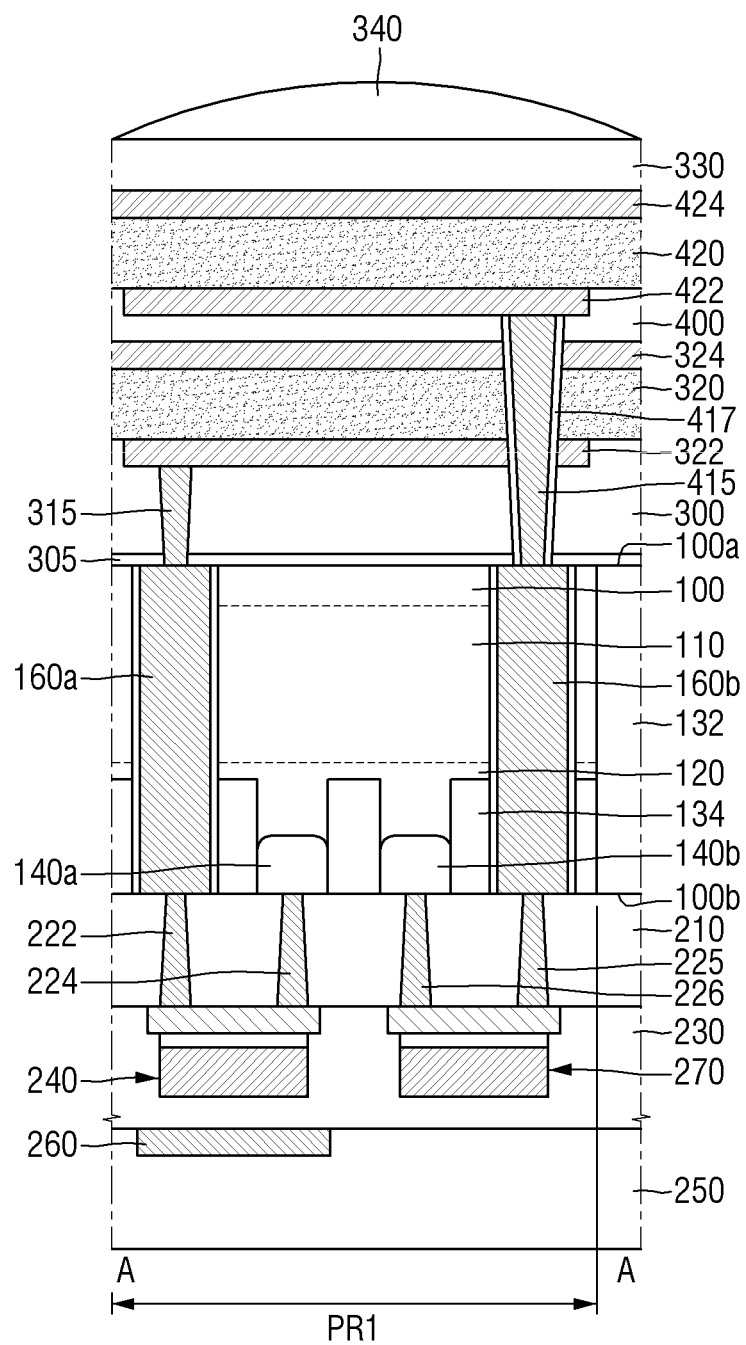
FIG. 19 is an example cross-sectional view for explaining the image sensor of FIG. 18.

FIG. 18 is an example circuit diagram of a unit pixel region of an image sensor according to some embodiments of the present inventive concept. FIG. 19 is an example cross-sectional view for explaining the image sensor of FIG. 18. For the sake of convenience of explanation, repeated parts of description provided with reference to FIGS. 1 to 6 will be briefly explained or omitted.

Referring to FIG. 18, in the image sensor according to some embodiments, the unit pixel region PU further includes a second organic photoelectric conversion element OPD2, a third transfer transistor OTG2, a third floating diffusion region OFD2, a third reset transistor ORG2, a third source follower transistor OSF2, and a third selection transistor OSEL2.

Since the second organic photoelectric conversion element OPD2, the third transfer transistor OTG2, the third floating diffusion region OFD2, the third reset transistor ORG2, the third source follower transistor OSF2 and the third selection transistor OSEL2 may be similar to the first organic photoelectric conversion device OPD1, the second transfer transistor OTG1, the second floating diffusion region OFD1, the second reset transistor ORG1, the second source follower transistor OSF1 and the second selection transistor OSEL1, respectively, the detailed explanation thereof will not be provided below.

Further, since the third transfer signal OTX2, the third selection signal OSX2 and the third reset signal ORX2 are similar to the second transfer signal OTX1, the second selection signal OSX1 and the second reset signal ORX1, respectively, the detailed explanation thereof will not be provided below.

Referring to FIG. 19, the image sensor according to some embodiments further includes a third floating diffusion region 140*b*, a second penetration via 160*b*, a second lower electrode 422, a second organic photoelectric conversion layer 420, a second upper electrode 424, a second penetration via 160*b* and a second transistor structure 270.

For example, the first element separation film 134 may define the third floating diffusion region 140*b* in the well impurity layer 120. In some embodiments, the third floating diffusion region 140*b* may be spaced apart from the second floating diffusion region 140*a*. The third floating diffusion region 140*b* may be connected to the second organic photoelectric conversion layer 420 and store the electric signal generated from the second organic photoelectric conversion layer 420. The third floating diffusion region 140*b* may correspond to the third floating diffusion region OFD2 of FIG. 18.

The second penetration via 160b penetrates the substrate 100 and may extend from the first surface 100a to the second surface 100b. In some embodiments, the second penetration via 160b may be spaced apart from the first penetration via 160a.

The second lower electrode 422 may be formed on the first upper electrode 324. For example, a fifth interlayer insulating film 400 may be formed on the first upper electrode 324, and the second lower electrode 422 may be formed on the fifth interlayer insulating film 400.

The second organic photoelectric conversion layer 420 may be formed on the second lower electrode 422. The second organic photoelectric conversion layer 420 may generate photocharge in proportion to the amount of light incident from the outside. The second organic photoelectric conversion layer 420 may correspond to the second organic photoelectric conversion element OPD2 of FIG. 18.

In some embodiments, the second organic photoelectric conversion layer 420 may detect light of a wavelength different from the semiconductor photoelectric conversion layer 110 and the first organic photoelectric conversion layer 320. For example, the second organic photoelectric conversion layer 420 may detect blue light, the first organic photoelectric conversion layer 320 may detect green light, and the semiconductor photoelectric conversion layer 110 may detect red light.

In some embodiments, the first color filter 310 may be omitted.

The second upper electrode 424 may be formed on the second organic photoelectric conversion layer 420. Voltages of different levels from each other may be applied to the second lower electrode 422 and the second upper electrode 424 so that the electric signal generated from the second organic photoelectric conversion layer 420 is directed to the second lower electrode 422.

The second organic photoelectric conversion layer 420 may be connected to the second penetration via 160b. For example, the second lower electrode 422 connected to the second organic photoelectric conversion layer 420 may be electrically connected to the second penetration via 160b through an eighth contact 415. In some embodiments, a first contact insulator 417 may surround the sidewalls of the eighth contact 415. That is, the first contact insulator 417 may electrically insulate the first lower electrode, the first organic photoelectric conversion layer 320 and the first upper electrode 324 from the eighth contact 415.

The second transistor structure 270 may be disposed to be spaced apart from the second surface 100b of the substrate 100. In some embodiments, the second transistor structure 270 may be a transfer transistor that transmits the electric signal, which is generated from the second organic photoelectric conversion layer 420, to the third floating diffusion region 140b. For example, the second transistor structure 270 may correspond to the third transfer transistor OTG2 of FIG. 18.

The second transistor structure 270 may connect the second organic photoelectric conversion layer 420 and the third floating diffusion region 140b. For example, the second penetration via 160b connected to the second organic photoelectric conversion layer 420 may be connected to the second transistor structure 270 via a ninth contact 225. Also, for example, the second transistor structure 270 may be connected to the third floating diffusion region 140b through a tenth contact 226.

Figure 20:
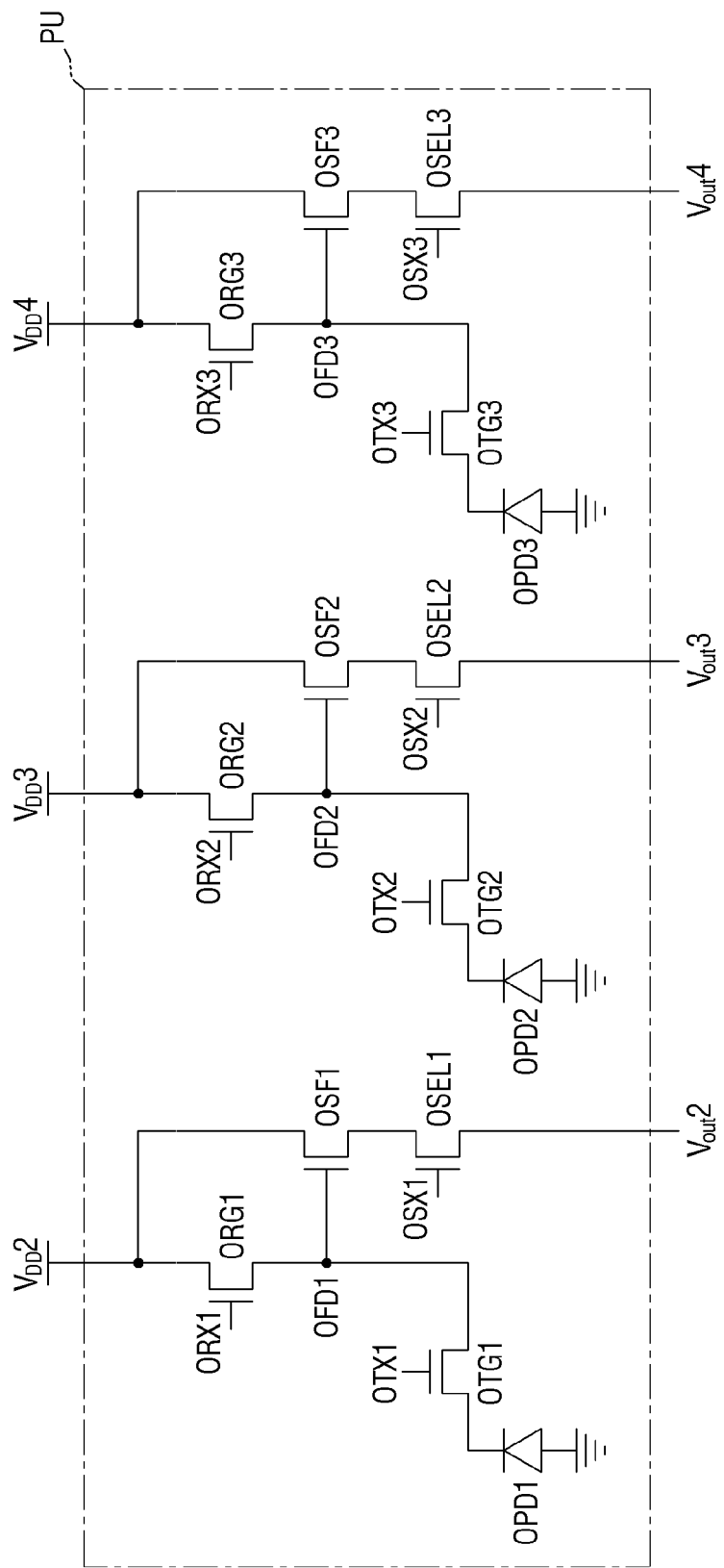
FIG. 20 is an example circuit diagram of a unit pixel region of an image sensor according to some embodiments of the present inventive concept.
Figure 21:
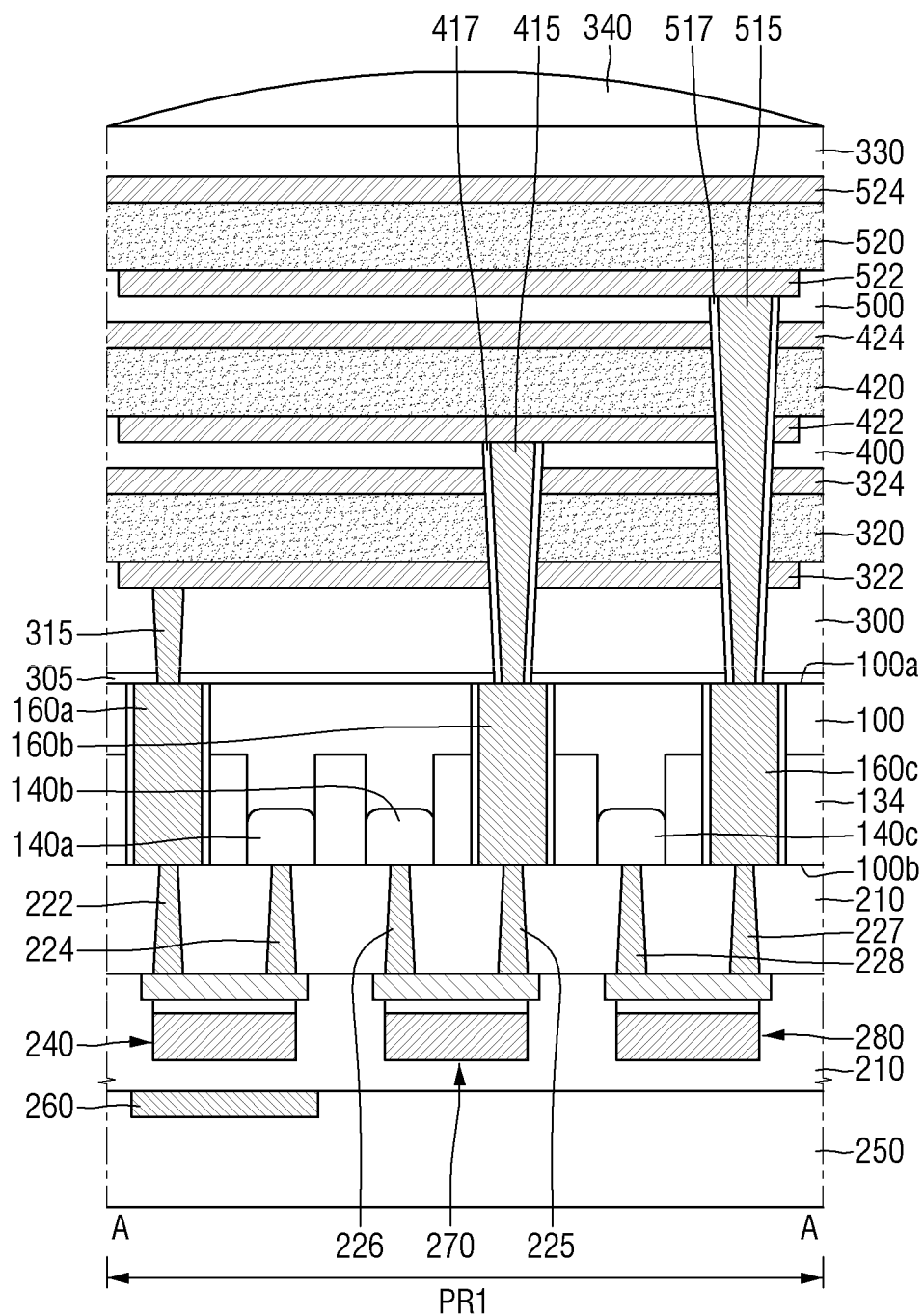
FIG. 21 is an example cross-sectional view for explaining the image sensor of FIG. 20.

FIG. 20 is an example circuit diagram of a unit pixel region of an image sensor according to some embodiments of the present inventive concept. FIG. 21 is an example cross-sectional view for explaining the image sensor of FIG. 20. For the sake of convenience of explanation, repeated parts of description provided with reference to FIGS. 1 to 6, 18 and 19 will be briefly explained or omitted.

Referring to FIG. 20, in the image sensor according to some embodiments, a unit pixel region PU further includes a third organic photoelectric conversion element OPD3, a fourth transfer transistor OTG3, a fourth floating diffusion region OFD3, a fourth reset transistor ORG3, a fourth source follower transistor OSF3, and a fourth selection transistor OSEL3.

Since the third organic photoelectric conversion element OPD3, the fourth transfer transistor OTG3, the fourth floating diffusion region OFD3, the fourth reset transistor ORG3, the fourth source follower transistor OSF3 and the fourth selection transistor OSEL3 may be similar to the first organic photoelectric conversion element OPD1, the second transfer transistor OTG1, the second floating diffusion region OFD1, the second reset transistor ORG1, the second source follower transistor OSF1 and the second selection transistor OSEL1, respectively, the detailed explanation thereof will not be provided below.

Further, since the fourth transfer signal OTX3, the fourth selection signal OSX3, and the fourth reset signal ORX2 are similar to the second transfer signal OTX1, the second selection signal OSX1 and the second reset signal ORX1, respectively, the detailed explanation thereof will not be described below.

Referring to FIG. 21, the image sensor according to some embodiments further includes a fourth floating diffusion region 140c, a third penetration via 160c, a third lower electrode 522, a third organic photoelectric conversion layer 520, a third upper electrode 524, and a third transistor structure 280.

For example, the first element separation film 134 may define a fourth floating diffusion region 140c in the well impurity layer 120. In some embodiments, the fourth floating diffusion region 140c may be spaced apart from the first and second floating diffusion regions 140a and 140b. The fourth floating diffusion region 140c is connected to the third organic photoelectric conversion layer 520 and may store the electric signal generated from the third organic photoelectric conversion layer 520. The fourth floating diffusion region 140c may correspond to the fourth floating diffusion region OFD3 of FIG. 20.

The third penetration via 160c penetrates the substrate 100 and may extend from the first surface 100a to the second surface 100b. In some embodiments, the third penetration via 160c may be spaced apart from the first and second penetration vias 160a and 160b.

The third lower electrode 522 may be formed on the second upper electrode 424. For example, the sixth interlayer insulating film 500 may be formed on the second upper electrode 424, and the third lower electrode 522 may be formed on the sixth interlayer insulating film 500.

The third organic photoelectric conversion layer 520 may be formed on the third lower electrode 522. The third organic photoelectric conversion layer 520 may generate photocharge in proportion to the amount of light incident from the outside. The third organic photoelectric conversion layer 520 may correspond to the third organic photoelectric conversion element OPD3 of FIG. 20.

In some embodiments, the third organic photoelectric conversion layer 520 may detect light of wavelength different from the first organic photoelectric conversion layer 320 and the second organic photoelectric conversion layer 420. For example, the third organic photoelectric conversion layer 520 may detect blue light, the second organic photoelectric conversion layer 420 may detect green light, and the first organic photoelectric conversion layer 320 may detect red light.

In some embodiments, the first color filter 310 may be omitted. Also, in some embodiments, the semiconductor photoelectric conversion layer 110 may be omitted.

The third upper electrode 524 may be formed on the third organic photoelectric conversion layer 520. Voltages of different levels from each other may be applied to the third lower electrode 522 and the third upper electrode 524 so that the electric signal generated from the third organic photoelectric conversion layer 520 is directed to the third lower electrode 522.

The third organic photoelectric conversion layer 520 may be connected to the third penetration via 160c. For example, the third lower electrode 522 connected to the third organic photoelectric conversion layer 520 may be electrically connected to the third penetration via 160c through an eleventh contact 515. In some embodiments, the second contact insulator 517 may surround the sidewalls of the eleventh contact 515. That is, the second contact insulator 517 may electrically insulate the first lower electrode 322, the first organic photoelectric conversion layer 320, the first upper electrode 324, the second lower electrode 422, the second organic photoelectric conversion layer 420 and the second upper electrode 424 from the eleventh contact 515.

The third transistor structure 280 may be disposed to be spaced apart from the second surface 100b of the substrate 100. In some embodiments, the third transistor structure 280 may be a transfer transistor that transmits the electric signals, which is generated from the third organic photoelectric conversion layer 520, to the fourth floating diffusion region 140c. For example, the third transistor structure 280 may correspond to the fourth transfer transistor OTG3 of FIG. 20.

The third transistor structure 280 may connect the third organic photoelectric conversion layer 520 and the fourth floating diffusion region 140c. For example, the third penetration via 160c connected to the third organic photoelectric conversion layer 520 may be connected to the third transistor structure 280 through a twelfth contact 227. Further, for example, the third transistor structure 280 may be connected to the fourth floating diffusion region 140c through a thirteenth contact 228.

Figure 22:
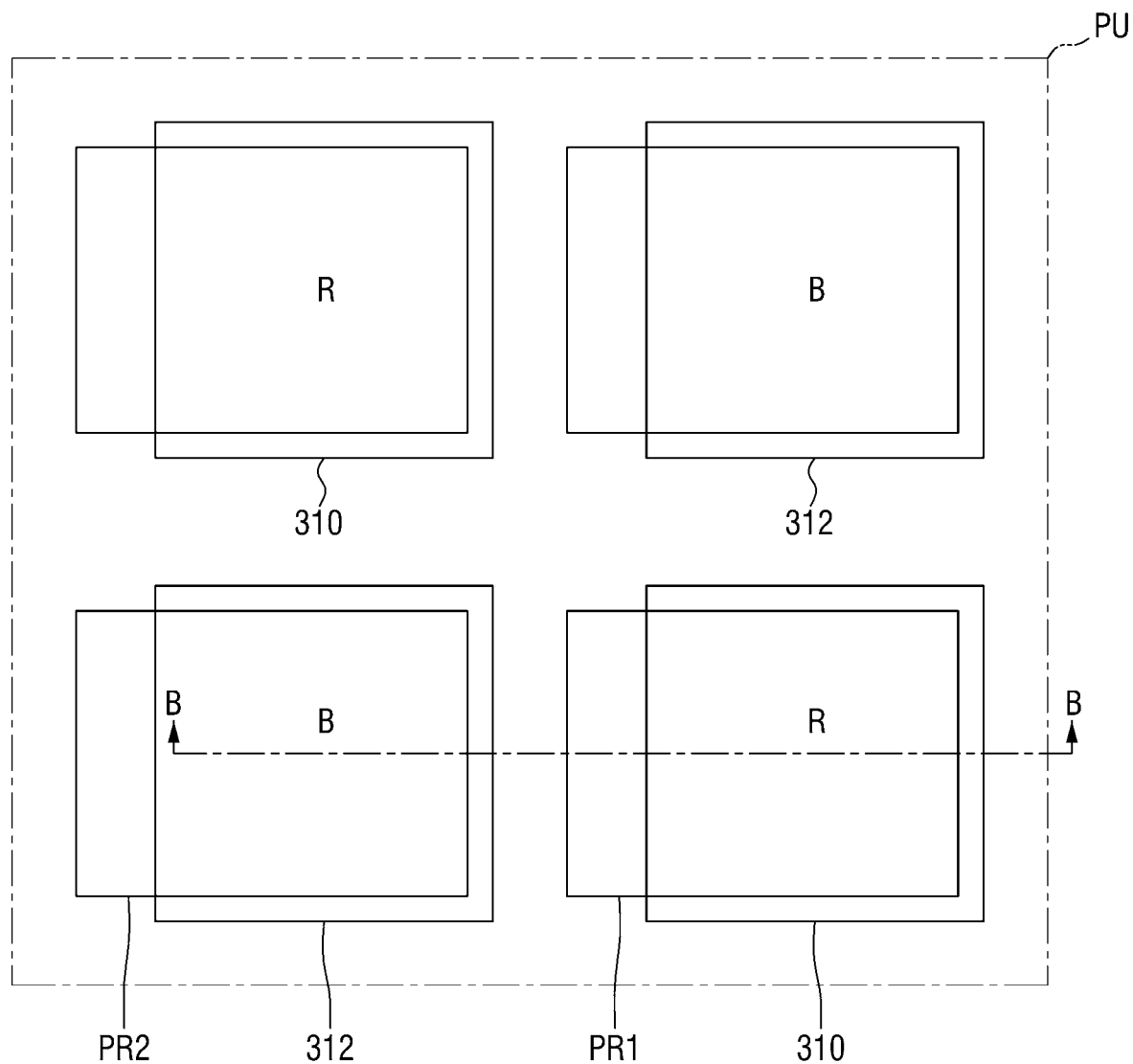
FIG. 22 is a layout diagram for explaining a unit pixel region of an image sensor according to some embodiments of the present inventive concept.
Figure 23:
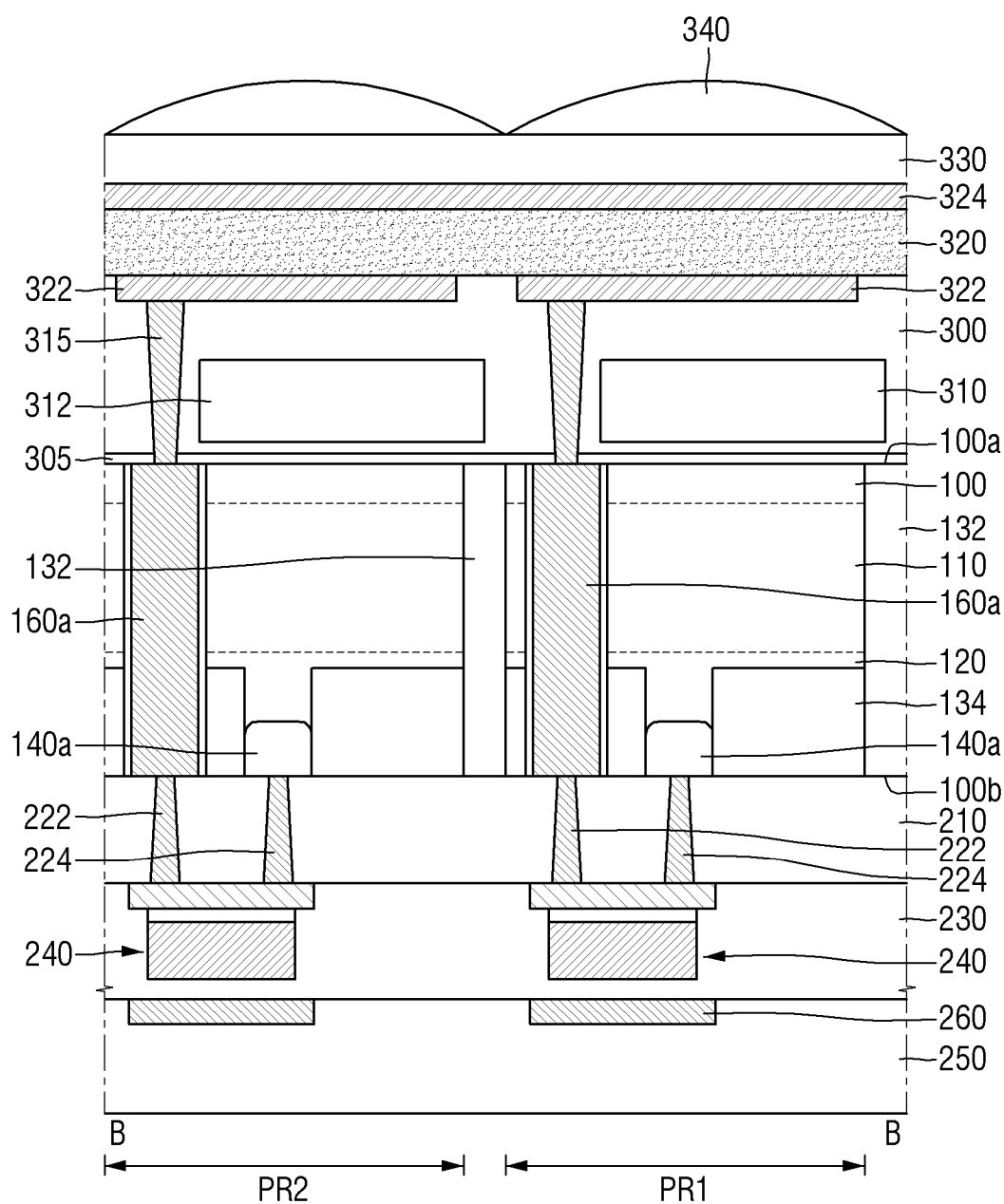
FIG. 23 is an example cross-sectional view taken along the line B-B of FIG. 22.

FIG. 22 is a layout diagram for explaining a unit pixel region of an image sensor according to some embodiments of the present inventive concept. FIG. 23 is an example cross-sectional view taken along the line B-B of FIG. 22. For the sake of convenience of explanation, repeated parts of description provided with reference to FIGS. 1 to 21 will be briefly explained or omitted.

Referring to FIGS. 22 and 23, in the image sensor according to some embodiments, the unit pixel region PU further includes a second pixel PR2.

The second pixel PR2 may detect light having a wavelength different from that of the first pixel PR1. For example, the semiconductor photoelectric conversion layer 110 in the first pixel PR1 may detect red light, and the semiconductor photoelectric conversion layer 110 in the second pixel PR2 may detect blue light.

For example, a first color filter 310 which is a red color filter R may be disposed in the first pixel PR1, and a second color filter 312 which is a blue color filter B may be disposed in the second pixel PR2. As illustrated in FIG. 22, in some embodiments, the red color filter R and the blue color filter B may be alternately arranged.

In concluding the detailed description, those skilled in the art will appreciate that many variations and modifications may be made to the example embodiments without substantially departing from the principles of the present inventive concept. Therefore, the disclosed example embodiments of the present inventive concept are used in a generic and descriptive sense only and not for purposes of limitation.

What is claimed is:

1. An image sensor comprising:
   a substrate including a first surface and a second surface opposite to each other;
   a first organic photoelectric conversion layer on the first surface of the substrate;
   a first penetration via connected to the first organic photoelectric conversion layer and extending through the substrate;
   a first floating diffusion region in the substrate adjacent to the second surface of the substrate; and
   a first transistor structure on the second surface of the substrate,
   wherein the first transistor structure includes a semiconductor layer configured to connect the first penetration via and the first floating diffusion region, a gate electrode on the semiconductor layer, and a gate dielectric film between the semiconductor layer and the gate electrode.

2. The image sensor of claim 1, wherein the semiconductor layer is spaced apart from the second surface of the substrate.

3. The image sensor of claim 1, further comprising:
   a semiconductor photoelectric conversion layer in the substrate.

4. The image sensor of claim 3, further comprising:
   a color filter between the first surface of the substrate and the first organic photoelectric conversion layer.

5. The image sensor of claim 1, further comprising:
   a second organic photoelectric conversion layer on the first organic photoelectric conversion layer;
   a second penetration via connected to the second organic photoelectric conversion layer and extending through the substrate;
   a second floating diffusion region in the substrate adjacent to the second surface of the substrate; and
   a second transistor structure on the second surface of the substrate and configured to connect the second penetration via and the second floating diffusion region.

6. The image sensor of claim 5, wherein the first organic photoelectric conversion layer and the second organic photoelectric conversion layer absorb light of wavelengths different from each other.

7. The image sensor of claim 1, further comprising:
   an interlayer insulating film between the first surface of the substrate and the first organic photoelectric conversion layer; and
   a contact in the interlayer insulating film and connecting the first organic photoelectric conversion layer and the first penetration via.

8. The image sensor of claim 1, further comprising:
   an interlayer insulating film between the second surface of the substrate and the semiconductor layer;
   a first contact in the interlayer insulating film and connecting the first penetration via and the semiconductor layer; and
   a second contact in the interlayer insulating film and connecting the first floating diffusion region and the semiconductor layer.

9. The image sensor of claim 1, wherein the semiconductor layer includes indium gallium zinc oxide (IGZO).

10. An image sensor comprising:
a substrate including a first surface configured to receive incident light and a second surface opposite to the first surface;
a floating diffusion region in the substrate adjacent to the second surface of the substrate;
a penetration via extending through the substrate;
a first interlayer insulating film on the second surface of the substrate;
a first contact in the first interlayer insulating film and connected to the penetration via;
a second contact in the first interlayer insulating film and connected to the floating diffusion region; and
a transistor structure on the first interlayer insulating film,
wherein the transistor structure includes a semiconductor layer configured to connect the first contact and the second contact, a gate electrode on the semiconductor layer, and a gate dielectric film between the semiconductor layer and the gate electrode.

11. The image sensor of claim 10, wherein the semiconductor layer includes a third surface facing the second surface of the substrate, and a fourth surface opposite to the third surface, and
the first contact and the second contact are connected to the third surface of the semiconductor layer.

12. The image sensor of claim 11, wherein the gate dielectric film and the gate electrode are disposed on the third surface of the semiconductor layer.

13. The image sensor of claim 11, wherein the gate dielectric film and the gate electrode are disposed on the fourth surface of the semiconductor layer.

14. The image sensor of claim 10, wherein the semiconductor layer includes a third surface facing the second surface, and a fourth surface opposite to the third surface, and
the first contact and the second contact are connected to the fourth surface of the semiconductor layer.

15. The image sensor of claim 10, further comprising:
a second interlayer insulating film, the first interlayer insulating film extending between the substrate and the second interlayer insulating film;
a third contact and a fourth contact in the second interlayer insulating film;
a first wiring which connects the first contact and the third contact; and
a second wiring which connects the second contact and the fourth contact.

16. An image sensor comprising:
a substrate including a first surface and a second surface opposite to each other;
a first floating diffusion region in the substrate;
a first lower electrode, a first organic photoelectric conversion layer and a first upper electrode sequentially stacked on the first surface of the substrate; and
a first transfer transistor on the second surface of the substrate and configured to connect the first lower electrode and the first floating diffusion region,
wherein the first transfer transistor is spaced apart from the second surface of the substrate.

17. The image sensor of claim 16, further comprising:
a source follower transistor configured to be controlled by the first floating diffusion region to generate an output voltage;
a selection transistor configured to output the output voltage; and
a reset transistor configured to reset the first floating diffusion region.

18. The image sensor of claim 16, further comprising:
a semiconductor photoelectric conversion layer in the substrate.

19. The image sensor of claim 18, further comprising:
a second floating diffusion region connected to the semiconductor photoelectric conversion layer;
a source follower transistor configured to be controlled by the second floating diffusion region to generate an output voltage;
a selection transistor configured to output the output voltage; and
a reset transistor configured to reset the second floating diffusion region.

20. The image sensor of claim 16, further comprising:
a second floating diffusion region in the substrate;
a second lower electrode, a second organic photoelectric conversion layer and a second upper electrode sequentially stacked on the first upper electrode; and
a second transfer transistor on the second surface of the substrate and configured to connect the second lower electrode and the second floating diffusion region,
wherein the second transfer transistor is spaced apart from the second surface of the substrate.

* * * * *